(12) United States Patent
Kim et al.

(10) Patent No.: US 11,076,485 B2
(45) Date of Patent: Jul. 27, 2021

(54) COMPONENT MOUNTED BOARD AND ELECTRONIC DEVICE COMPRISING THE SAME

(71) Applicant: SAMSUNG ELECTRO-MECHANICS CO., LTD., Suwon-si (KR)

(72) Inventors: Tae Seong Kim, Suwon-si (KR); Yun Je Ji, Suwon-si (KR); Ho Kwon Yoon, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/857,282

(22) Filed: Apr. 24, 2020

(65) Prior Publication Data

US 2021/0136916 A1    May 6, 2021

(30) Foreign Application Priority Data

Nov. 5, 2019 (KR) .................. 10-2019-0140402
Feb. 26, 2020 (KR) .................. 10-2020-0023410

(51) Int. Cl.
*H05K 1/11* (2006.01)
*H05K 1/14* (2006.01)
*H05K 1/02* (2006.01)

(52) U.S. Cl.
CPC ............. *H05K 1/148* (2013.01); *H05K 1/028* (2013.01); *H05K 1/118* (2013.01); *H05K 2201/042* (2013.01); *H05K 2201/1059* (2013.01)

(58) Field of Classification Search
USPC .......................................... 361/785
See application file for complete search history.

(56) References Cited

U.S. PATENT DOCUMENTS

2004/0227258 A1* 11/2004 Nakatani ............. H01L 23/5385
                                                                  257/787
2009/0175015 A1*  7/2009 Mukouyama .......... H05K 1/148
                                                                  361/785
2018/0368261 A1* 12/2018 Kwak .................... H05K 1/148

FOREIGN PATENT DOCUMENTS

JP        2003-158356 A     5/2003
JP        2009-164387 A     7/2009

* cited by examiner

*Primary Examiner* — Andargie M Aychillhum
(74) *Attorney, Agent, or Firm* — Morgan, Lewis & Bockius LLP

(57) ABSTRACT

A component mounting board includes first and second substrates, a connection substrate, an interposer, and an electronic component. The first substrate has first and second surfaces opposing each other, a first side surface between the first and second surfaces, and a first signal pattern. The second substrate is disposed on the first substrate, has third and fourth surfaces opposing each other and a second side surface between the third and fourth surfaces, and includes a second signal pattern. The connection substrate is bent to connect the first and second side surfaces, and the interposer is disposed between the first and third surfaces and electrically connects the first and second signal patterns. The electronic component is mounted on at least one of the first to fourth surfaces.

20 Claims, 24 Drawing Sheets

COMPONENT MOUNTED BOARD AND ELECTRONIC DEVICE COMPRISING THE SAME

CROSS-REFERENCE TO RELATED APPLICATION(S)

This application claims benefit of priority to Korean Patent Application No. 10-2019-0140402 filed on Nov. 5, 2019, and Korean Patent Application No. 10-2020-0023410 filed on Feb. 26, 2020 in the Korean Intellectual Property Office, the disclosures of which are incorporated herein by reference in their entireties.

BACKGROUND

1. Field

The present disclosure relates to a component mounting board and an electronic device comprising the same.

2. Description of Related Art

In electronic devices such as smartphones, as the importance of camera performance continues to increase, the number of cameras or number of pixels of a camera increases. In addition, in order to improve utilization of multimedia, a speaker of a receiver disposed on an upper portion should also be larger than a certain size. For this reason, competition for space used for arranging a camera module and/or a speaker on a main board is also continuously increasing. Therefore, in recent years, securing a component mounting space of the main board has emerged as an important technology.

SUMMARY

An aspect of the present disclosure is to provide a component mounting board and an electronic device comprising the same, which may sufficiently secure a component mounting space through innovative space utilization.

Another aspect of the present disclosure is to provide a component mounting board and an electronic device comprising the same which may efficiently design a signal transmission path.

Another aspect of the present disclosure is to provide a component mounting board and an electronic device comprising the same which may improve a problem of a warpage phenomenon or a solder non-bonding phenomenon.

Another aspect of the present disclosure is to provide a component mounting board and an electronic device comprising the same which may reduce costs.

According to an aspect of the present disclosure, a component mounting board is provided in which first and second substrates, that are relatively rigid, are connected by a relatively flexible substrate, and an interposer, providing a signal transmission path of electronic components mounted on the first and second substrates, is disposed between the first and second substrates.

According to another aspect of the present disclosure, a component mounting board includes a first substrate including a first signal pattern and having a first surface, a second surface opposing the first surface, and a first side surface between the first and second surfaces. A second substrate is disposed on the first substrate, has a third surface, a fourth surface opposing the third surface, and a second side surface between the third and fourth surfaces, and includes a second signal pattern. A connection substrate is bent to connect the first and second side surfaces, and an interposer is disposed between the first and third surfaces and electrically connects the first and second signal patterns. An electronic component is mounted on at least one of the first to fourth surfaces.

According to another aspect of the present disclosure, an electronic device includes the above-described component mounting board.

According to a further aspect of the present disclosure, a component mounting board includes a first substrate having first and second surfaces opposing each other, and a through-opening disposed within a smallest convex outline extending around a periphery of the first substrate and extending from the first surface to the second surface. A second substrate is disposed on the first substrate, and has a third surface facing the first surface and a fourth surface opposing the third surface, and a connection substrate extends between a first side surface of the first substrate abutting the through-opening and a second side surface of the second substrate abutting the third and fourth surfaces of the second substrate.

According to another aspect of the present disclosure, a component mounting board includes a first substrate having a plurality of signal patterns, and an interposer substrate disposed on a first surface of the first substrate, having an area smaller than the first surface of the first substrate, and including a plurality of vias connected to respective signal patterns of the plurality of signal patterns of the first substrate. A second substrate is disposed on the interposer substrate to face the first substrate, and has a plurality of signal patterns connected to respective vias of the plurality of vias of the interposer substrate, and a connection substrate is bent to connect a first side surface of the first substrate and a second side surface of the second substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
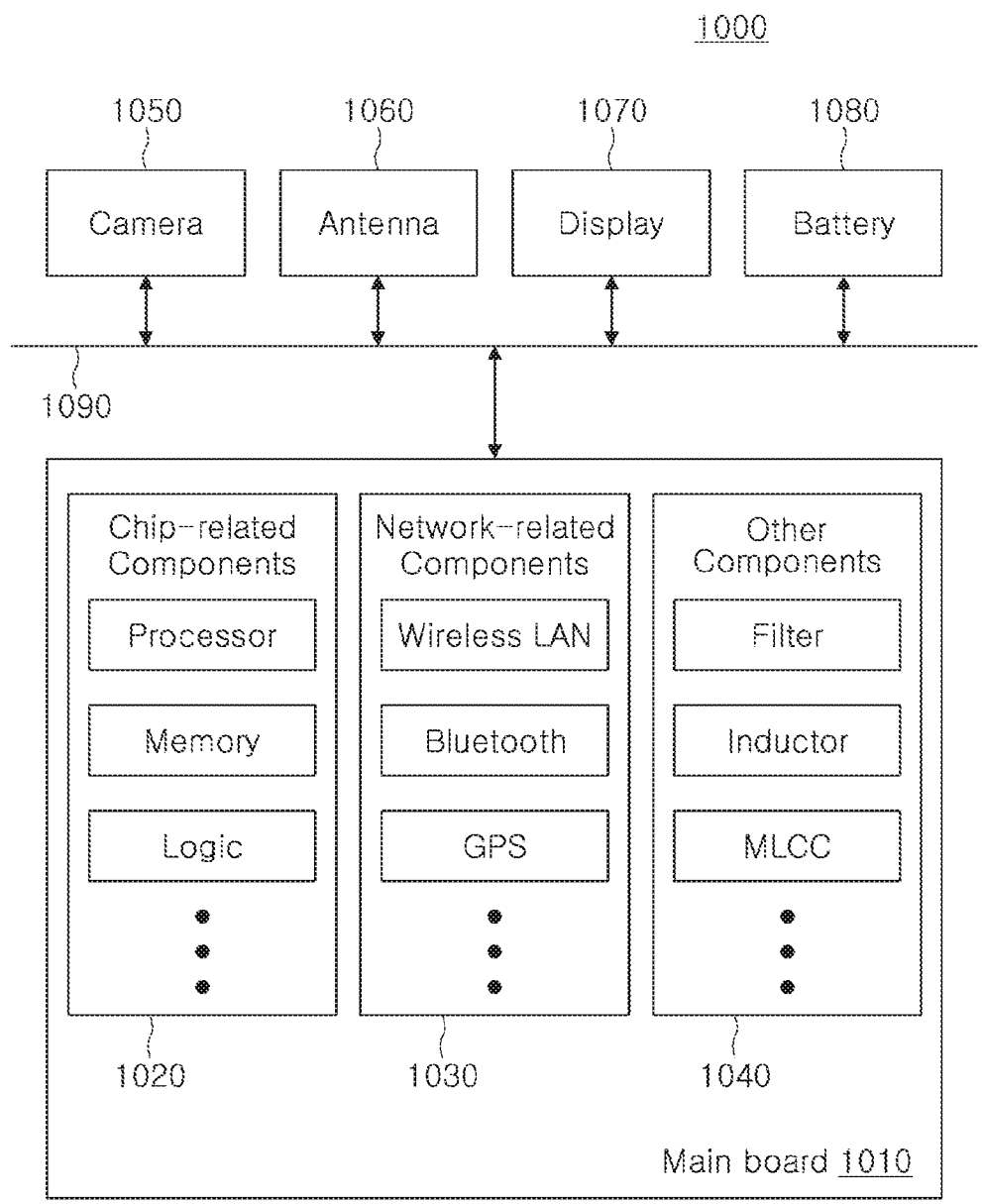
FIG. 1 is a block diagram schematically illustrating an example of an electronic device system.

Hereinafter, the present disclosure will be described with reference to the accompanying drawings. Shapes and sizes of the elements in the drawings may be exaggerated or reduced for more clear depiction.

Electronic Device

FIG. 1 is a block diagram schematically illustrating an example of an electronic device system.

Referring to the drawings, an electronic device 1000 may accommodate a main board 1010 therein. The main board 1010 may include chip-related components 1020, network related components 1030, other components 1040, and the like, physically and/or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, but may also include other types of chip-related components. In addition, the chip-related components 1020 may be combined with each other. The chip-related component 1020 may be in the form of a package including the above-described chip or an electronic component.

The network related components 1030 may include components compatible with protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with a variety of other wireless or wired standards or protocols. In addition, the network related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display 1070, a battery 1080, or the like. However, these other components are not limited thereto, but may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
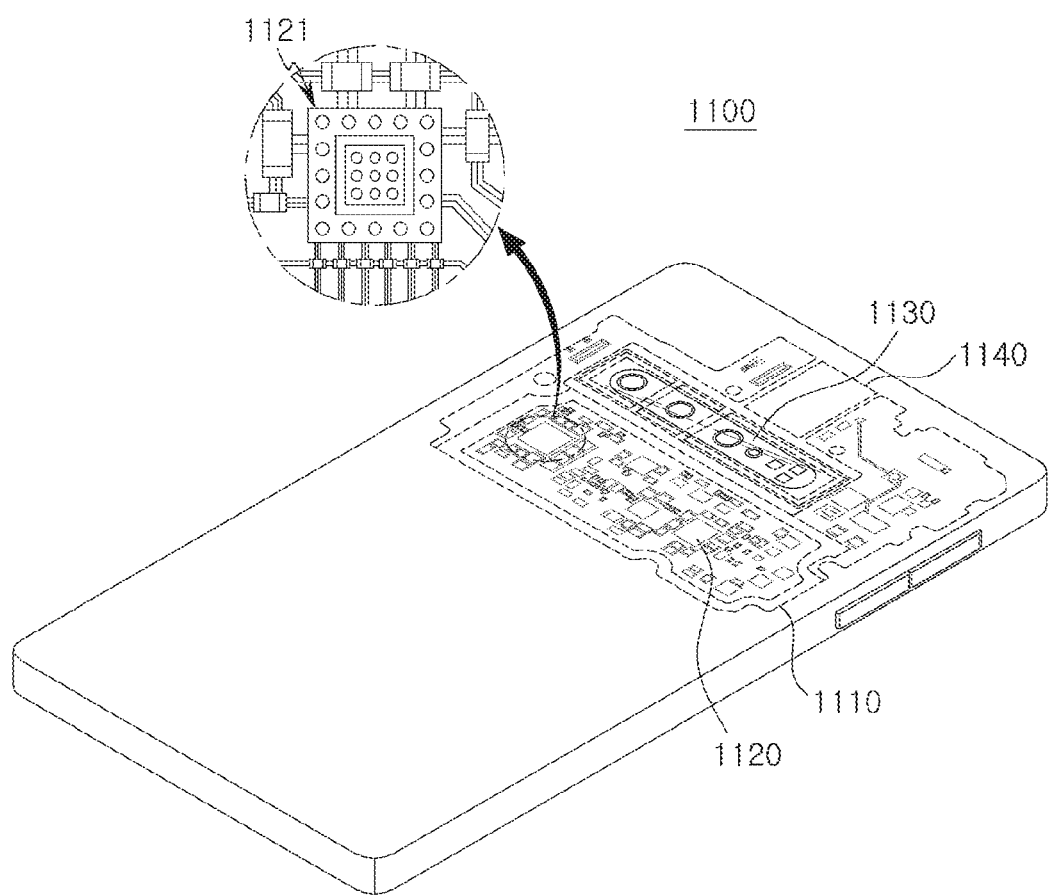
FIG. 2 is a perspective view schematically illustrating an example of an electronic device.

FIG. 2 is a perspective view schematically illustrating an example of an electronic device.

Referring to the drawings, an electronic device may be, for example, a smartphone 1100. A printed circuit board 1110 used as a main board may be accommodated in the smartphone 1100, and various electronic components 1120 may be physically and/or electrically connected to the printed circuit board 1110. In addition, other electronic components, such as a camera module 1130 and/or a speaker 1140, which may or may not be physically and/or electrically connected to the printed circuit board 1110 may be accommodated therein. A portion of the electronic components 1120 may be the above-described chip-related components, for example, a semiconductor package 1121, but are not limited thereto. The electronic device is not necessarily limited to the smartphone 1100, but may be other electronic devices as described above.

Component Mounting Board

Figure 3:
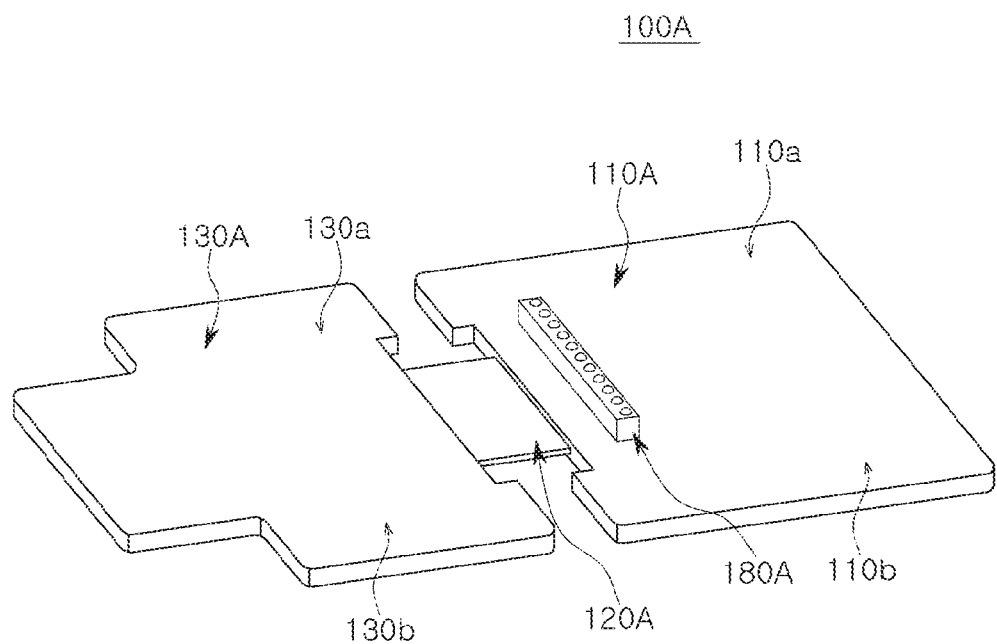
FIG. 3 is a perspective view schematically illustrating an example of a component mounting board.
Figure 4:
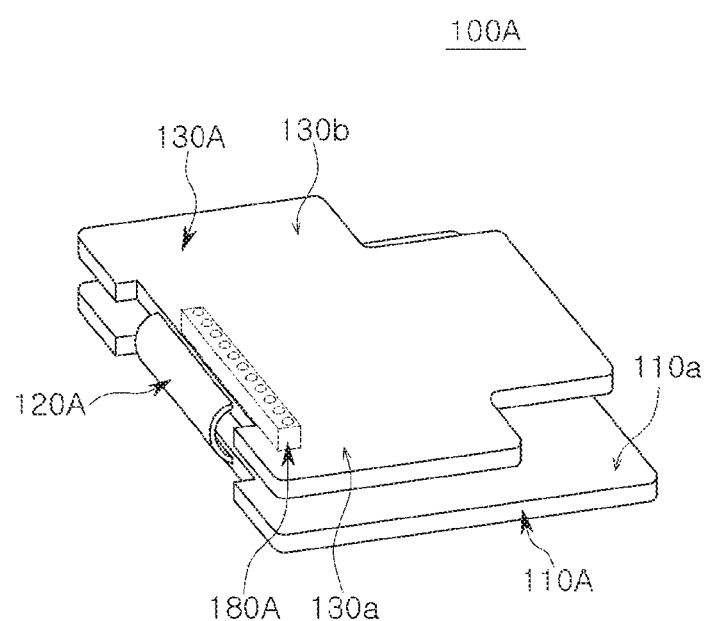
FIG. 4 is a perspective view schematically illustrating the connection substrate of FIG. 3 after bending.

FIG. 3 is a perspective view schematically illustrating an example of a component mounting board, and FIG. 4 is a perspective view schematically illustrating the connection substrate of FIG. 3 after bending.

Figure 5A:
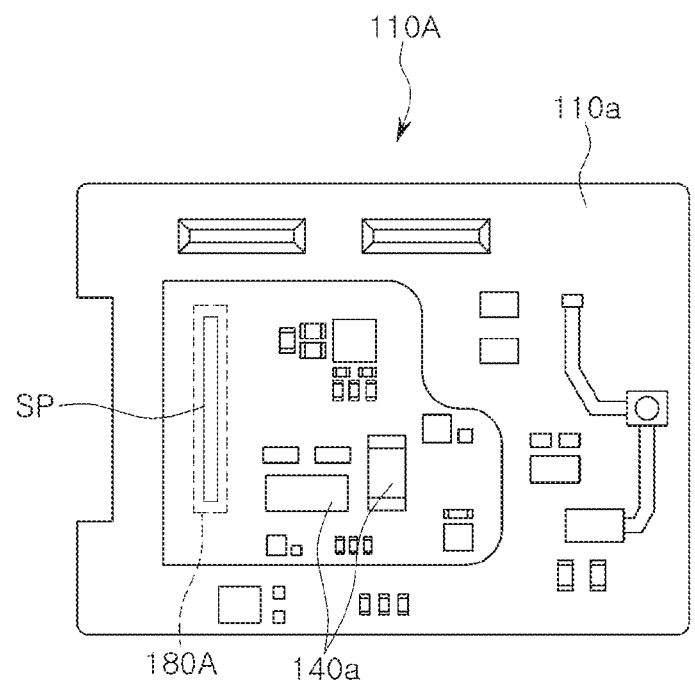
FIGS. 5A and 5B are plan views schematically illustrating the first and second surfaces of the first substrate of FIG. 3, respectively.
Figure 5B:
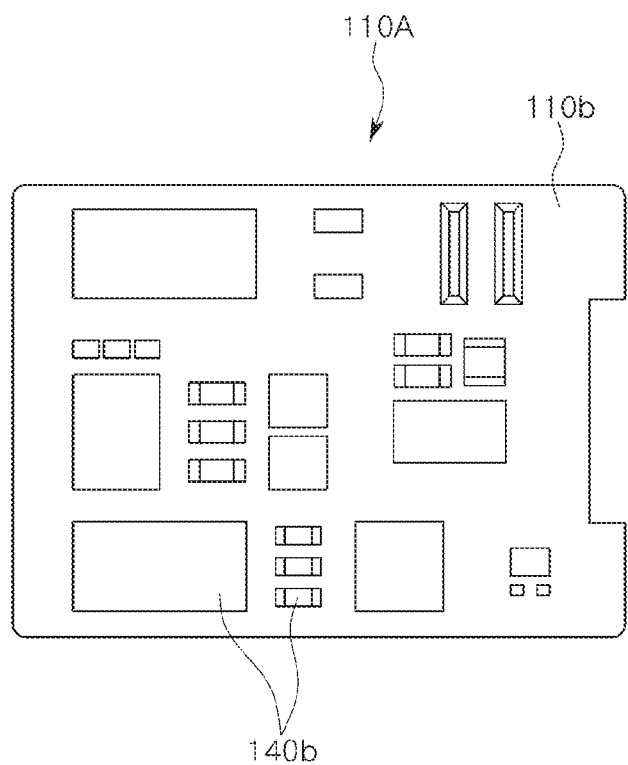
Figure 6A:
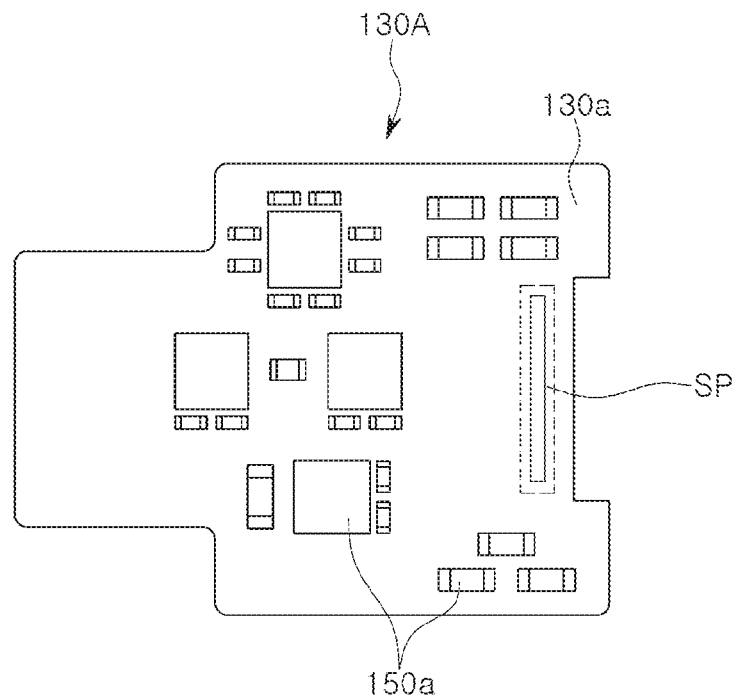
FIGS. 6A and 6B are plan views schematically illustrating the third and fourth surfaces of the second substrate of FIG. 3, respectively.
Figure 6B:
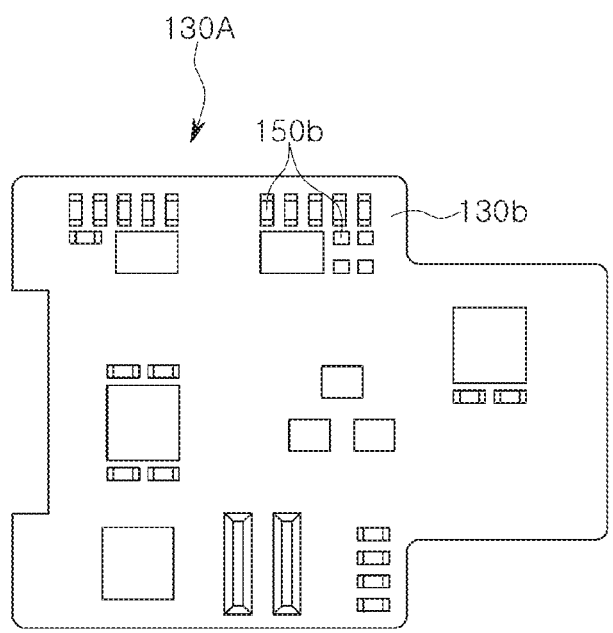

FIGS. 5A and 5B are plan views schematically illustrating the first and second surfaces of the first substrate of FIG. 3, respectively, and FIGS. 6A and 6B are plan views schematically illustrating the third and fourth surfaces of the second substrate of FIG. 3, respectively.

Referring to the drawings, a component mounting board 100A according to an example may include a first substrate 110A having a first surface 110a and a second surface 110b opposing the first surface 110a, a connection substrate 120A connected to the first substrate 110A, a second substrate 130A connected to the connection substrate 120A and having a third surface 130a and a fourth surface 130b opposing the third surface 130a, and an interposer 180A disposed on the first surface 110a of the first substrate 110A. The interposer 180A may be also disposed on the third surface 130a of the second substrate 130A.

Before the connection substrate 120A is bent, as illustrated in FIG. 3, the connection substrate 120A may connect a side surface between the first surface 110a and the second surface 110b of the first substrate 110A to a side surface between the third surface 130a and the fourth surface 130b of the second substrate 130A. The first substrate 110A, the connection substrate 120A, and the second substrate 130A may be arranged to have the first and second substrates parallel to each other (e.g., to have main surfaces thereof parallel to each other). When the connection substrate 120A is bent, as illustrated in FIG. 4, the second substrate 130A may be disposed on the first substrate 110A. When viewed in plan view, at least a portion of each of the first substrate 110A and the second substrate 130A may overlap each other (e.g., overlap each other in a first direction in which the first and second surfaces 110a and 110b oppose each other), and at least a portion of each of the first surface 110a of the first substrate 110A and the third surface 130a of the second substrate 130A may be connected to each other by the interposer 180A. For example, the connection substrate 120A may be a flexible substrate that may be bent such that at least a portion of the first surface 110a of the first substrate 110A faces at least a portion of the third surface 130a of the second substrate 130A. In this case, the flexible substrate may be bent such that the interposer 180A is also disposed on (or in contact with) the third surface 130a of the second substrate 130A, to connect the first surface 110a of the first substrate 110A and the third surface 130a of the second substrate 130A.

In electronic devices such as smartphones, as importance of camera performance continues to increase, the number of cameras or pixels of a camera increases. In addition, in order to improve utilization of multimedia, a speaker of a receiver disposed on an upper portion of a main board is also larger than a certain size. For this reason, competition for space for arranging a camera module and/or a speaker on a main board is also continuously increasing. Therefore, in recent years, securing mounting space for a component on the main board has emerged as an important technological problem. For example, it may be considered to apply a multilayer printed circuit board as a main board of a smartphone. To this end, it may be considered to prepare a main printed circuit board and a sub printed circuit board, and connect the main printed circuit board and the sub printed circuit board in a vertical direction by using an interposer substrate. At least three separately manufactured boards may be used as the multilayer printed circuit board, and, in addition to a process of mounting components on these boards, a separate assembly process for stacking and connecting these boards in a vertical direction may be used. Therefore, a time period for the manufacturing process may be lengthened, and assembly yield may be deteriorated due to occurrence of a warpage phenomenon in the interposer substrate during a preparation operation, or the costs thereof may be increased due to occurrence of failure such as a solder non-bonding phenomenon or the like, during an assembly operation.

In a component mounting board 100A according to an example, the second substrate 130A may be disposed on the first substrate 110A by bending the connection substrate 120A. For example, when the connection substrate 120A is bent, the second substrate 130A may be disposed on the first substrate 110A, and at least a portion of each of the first surface 110a of the first substrate 110A and the third surfaces 130a of the second substrate 130A may overlap each other, in a plan view. Therefore, the first substrate 110A, the connection substrate 120A, and the second substrate 130A may be configured to have a multilayer structure in a relatively simple manner. Therefore, compared with the multilayer structure described above, the manufacturing process may be relatively simple and the costs thereof may be reduced. In addition, since a signal transmission path between the first and second substrates 110A and 130A may be provided by the connection substrate 120A, a more efficient design of the signal transmission path is possible.

In addition, a component mounting board 100A according to an example may include the interposer 180A disposed on the first surface 110a of the first substrate 110A. The interposer 180A may be disposed in a desired position between the first substrate 110A and the second substrate 130A, when the connection substrate 120A is bent. For example, at least a portion of each of the first surface 110a of the first substrate 110A and the third surface 130a of the second substrate 130A may be connected to each other by the interposer 180A. The interposer 180A may have an area smaller than an area of each of the first substrate 110A and the second substrate 130A, when viewed in plan view. Unlike the large-area interposer substrate described above, since the interposer 180A may have a relatively small area, the interposer 180A may be produced at a relatively low cost, and there may be almost no problem of defects such as a warpage phenomenon, a solder non-bonding phenomenon, or the like. In addition, a signal transmission path between the first and second substrates 110A and 130A may be supplemented by the interposer 180A, and the signal transmission path may be arranged in the desired position and in the desired number to provide sufficient throughput. Therefore, the signal transmission path may be more efficiently designed. For example, the interposer 180A may be attached to a peripheral portion of a specific chip such as an application processor (AP) from which signal lines are most led-out. The interposer 180A may also serve as a spacer for physically supporting the first and second substrates 110A and 130A in the multilayer structure, after the connection substrate 120A is bent.

Hereinafter, components of a component mounting board 100A according to an example will be described in more detail with reference to the accompanying drawings.

The component mounting board 100A may include the first substrate 110A, the connection substrate 120A, and the second substrate 130A. Each of the first and second substrates 110A and 130A may have superior rigidity than the connection substrate 120A. Superior rigidity may refer that bending property is relatively less under the same conditions. For example, the connection substrate 120A may be relatively more flexible than the first and second substrates 110A and 130A. In addition, each of the first and second substrates 110A and 130A may be relatively more rigid than the connection substrate 120A. For example, a component mounting board 100A according to an example may be a rigid-flexible printed circuit board (RFPCB) having a rigid-flexible-rigid form. A cross-sectional structure of the RFPCB that may be applied to the component mounting board 100A is not particularly limited, and may be a known cored type of RFPCB having a relatively thick core layer therein, or may be a known coreless type of RFPCB formed by a coreless process and in which a core layer is omitted from an internal space thereof. For example, an internal cross-sectional structure thereof is not particularly limited.

The first substrate 110A and the second substrate 130A may each include one or more insulating layer(s), one or more wiring layer(s), and one or more via layer(s). Each wiring layer may be disposed on or in the insulating layer. Each via layer may electrically connect wiring layers arranged on different layers while penetrating an insulating layer. The number of layers of the insulating layer(s), the wiring layer(s), and the via layer(s) is not particularly limited, and may be a multilayer or a single layer depending on a design.

An insulating material may be used as a material of the insulating layer. In this case, as the insulating material, a thermosetting resin such as an epoxy resin, a thermoplastic resin such as polyimide, or materials including reinforcing materials such as inorganic fillers, and/or glass cloth, glass fabric, or the like, together therewith, a prepreg, Ajinomoto Build-up Film (ABF), a photoimageable dielectric (PID), and the like may be used. However, the present disclosure is not limited thereto, and, as a material of a specific insulating layer, a glass plate may be used, or a ceramic plate may be used. As necessary, at least one of liquid crystal polymer (LCP), polyimide (PI), cyclo olefin polymer (COP), polyphenylene ether (PPE), polyether ether ketone (PEEK), polytetrafluoroethylene (PTFE), and a derivative thereof, having a relatively low dielectric loss, may be included. When the insulating layer includes a plurality of insulating layers, materials of the various insulating layers may be the same or different from each other. When the plurality of insulating layers are used, an adhesive layer may be disposed between each insulating layer. As the adhesive layer, for example, at least one of an epoxy resin, PPE, and COP, or a derivative thereof, having a relatively low dielectric loss may be included.

A metal material may be used as a material of the wiring layer. In this case, as the metal material, copper (Cu), aluminum (Al), silver (Ag), tin (Sn), gold (Au), nickel (Ni), lead (Pb), titanium (Ti), alloys thereof, or the like may be used. The wiring layer may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. Each of the patterns may include a line pattern, a plane pattern, and/or a pad pattern.

A metal material may be used as a material of the via layer. In this case, as the metal material, copper (Cu), aluminum (Al), silver (Ag), tin (Sn), gold (Au), nickel (Ni), lead (Pb), titanium (Ti), alloys thereof, or the like may be used. A connection via of the via layer may be entirely filled with a metal material, or a metal material may be formed along a wall of a via hole. In addition, all known shapes such as a tapered shape, an hourglass shape, a cylindrical shape, or the like may be applied. The via layer may also perform various functions, depending on a design of the layer. For example, the via layer may include a connection via for signal connection, a connection via for ground connection, a connection via for power connection, and the like.

The connection substrate 120A may basically include an insulating layer, and may include a wiring layer and/or a via layer, as appropriate. The wiring layer may be disposed on or in the insulating layer. The via layer may electrically connect wiring layers arranged on different layers while penetrating an intervening insulating layer. The number of layers of the insulating layer(s), the wiring layer (s), and the via layer (s) is not particularly limited, and may be a multilayer or a single layer, respectively, depending on a design.

As a material of the insulating layer, a material having sufficient flexibility may be used. For example, PI, amorphous PI, polyethylene terephthalate (PET), polyethylene naphthalate (PEN), LCP, or an adhesive including an epoxy resin formulated to lower elastic modulus as a main material may be used, but are not limited thereto. For example, other known materials of relatively low elasticity and relatively low rigidity may be used. At least one of LCP, PI, COP, PPE, PEEK, and PTFE, or a derivative thereof, having a relatively low dielectric loss, may optionally be used. When the insulating layer includes a plurality of insulating layers, materials of the insulating layers may be the same or different from each other. When the plurality of insulating layers are used, an adhesive layer may be disposed between each insulating layer. As the adhesive layer, for example, at least one of an epoxy resin, PPE, and COP, or a derivative thereof, having a relatively low dielectric loss may be included.

A metal material may be used as a material of the wiring layer. In this case, as the metal material, copper (Cu), aluminum (Al), silver (Ag), tin (Sn), gold (Au), nickel (Ni), lead (Pb), titanium (Ti), alloys thereof, or the like may be used. The wiring layer may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example a data signal, and the like. Each of the patterns may include a line pattern, a plane pattern, and/or a pad pattern.

A metal material may be used as a material of the via layer. In this case, as the metal material, copper (Cu), aluminum (Al), silver (Ag), tin (Sn), gold (Au), nickel (Ni), lead (Pb), titanium (Ti), alloys thereof, or the like may be used. A connection via of the via layer may be entirely filled with a metal material, or a metal material may be formed along a wall of a via hole. In addition, all known shapes such as a tapered shape, an hourglass shape, and a cylindrical shape may be applied. The via layer may also perform various functions, depending on a design of the layer. For example, the via layer may include a connection via for signal connection, a connection via for ground connection, a connection via for power connection, and the like.

The interposer 180A may be disposed on the first surface 110a of the first substrate 110A, and, as appropriate, may be disposed on the third surface 130a of the second substrate 130A. After the connection substrate 120A is bent, the interposer 180A may be partially disposed in a desired position between the first and second substrates 110A and 130A. For example, at least a portion of each of the first surface 110a of the first substrate 110A and the third surface 130a of the second substrate 130A may be connected by the interposer 180A. The interposer 180A may be formed by preparing a large-area interposer substrate as relatively small sized units. The interposer 180A may have a hexahedron shape having a rectangular planar shape, but is not limited thereto.

The interposer 180A may be a substrate type of interposer. For example, the interposer 180A may include an insulating layer, a wiring layer, and a via layer. The wiring layer may be disposed on or in the insulating layer. The via layer may electrically connect wiring layers arranged on different layers while penetrating an intervening insulating layer. The number of layers of the insulating layer(s), the wiring layer(s), and the via layer(s) is not particularly limited, and may be a multilayer or a single layer depending on a design. For example, the present disclosure is not specifically limited thereto. The interposer 180A may include a plurality of connection metals disposed on surfaces facing the first surface 110a of the first substrate 110A, and disposed on opposite surfaces thereof (e.g., on surfaces thereof facing the third surface 130a in FIG. 4). The connection metals may be connected to the wiring layer on each of the surfaces thereof. After the connection substrate 120A is bent, the wiring layer on each of the surfaces of the interposer 180A may be electrically connected to signal pattern (s) SP of the first substrate 110A and signal pattern (s) SP of the second substrate 130A by the connection metal. As above, an efficient signal transmission path may be provided in an appropriate position of the surfaces 110a and 130a.

An insulating material may be used as a material of the insulating layer. In this case, as the insulating material, a thermosetting resin such as an epoxy resin, a thermoplastic resin such as polyimide, or materials including reinforcing materials such as inorganic fillers, and/or glass cloth, glass fabric, or the like, together therewith, such as a prepreg, ABF, PID, and the like may be used. However, the present disclosure is not limited thereto, and silicon (Si) may be used as the material of the insulating layer. When a plurality of insulating layers are used, materials of the insulating layers may be the same or different from each other.

A metal material may be used as a material of the wiring layer. In this case, as the metal material, copper (Cu), aluminum (Al), silver (Ag), tin (Sn), gold (Au), nickel (Ni), lead (Pb), titanium (Ti), alloys thereof, or the like may be used. The wiring layer may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, such as for example a data signal and the like. Each of the patterns may include a line pattern, a plane pattern, and/or a pad pattern.

A metal material may be used as a material of the via layer. In this case, as the metal material, copper (Cu), aluminum (Al), silver (Ag), tin (Sn), gold (Au), nickel (Ni), lead (Pb), titanium (Ti), alloys thereof, or the like may be used. A connection via of the via layer may be entirely filled with a metal material, or a metal material may be formed along a wall of a via hole. In addition, any known shape such as a tapered shape, a hourglass shape, a cylindrical shape, or the like may be applied. The via layer may also perform various functions, depending on a design of the layer. For example, the via layer may include a connection via for signal connection, a connection via for ground connection, a connection via for power connection, and the like.

The connection metal may provide a physical and/or electrical connection path. The connection metal may be made of a low melting point metal having a lower melting point than copper (Cu), for example tin (Sn) or an alloy containing tin (Sn). For example, the connection metal may be formed of a solder or the like, but the material thereof is not particularly limited thereto. The connection metal may be a land, a ball, a pin, or the like. The connection metal may be formed of multiple layers or a single layer. In a case of being formed in multiple layers, the connection metal may include a copper pillar and solder. In a case of being formed in a single layer, the connection metal may include a tin-silver solder, but is not limited thereto. The number, interval, arrangement, etc. of the connection metal are not particularly limited, and may be sufficiently modified depending on a design specification.

The component mounting board 100A may have a structure before bending the same, as illustrated in FIG. 3, or may have a structure after bending the same, as illustrated in FIG. 4. In addition, the component mounting board 100A may have a structure in which the electronic component is not mounted, or may have a module structure in which the electronic component is mounted, as appropriate. For example, the first electronic component 140a and/or the second electronic component 140b may be arranged on the first surface 110a and/or the second surface 110b of the first substrate 110A. In addition, the third electronic component 150a and/or the fourth electronic component 150b may be arranged on the third surface 130a and/or the fourth surface 130b of the second substrate 130A. Each of the first to fourth electronic components 140a, 140b, 150a, and 150b may be a chip-related component, a network related component, and other components. These components may be surface mounted on the component mounting board 100A, respectively, and may be electrically connected to each other by an internal wiring and the like of the component mounting board 100A. These components may be introduced into a structure before the bending of the component mounting board 100A. Alternatively, these components may be also introduced into a structure after the bending of the component mounting board 100A.

The chip-related components may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components are not limited thereto, but may also include other types of chip-related components. In addition, the chip-related components may be combined with each other. The chip-related component may be in the form of a package including the above-described chip or an electronic component.

The network related components 1030 may include components compatible with protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with a variety of other wireless or wired standards or protocols. In addition, the network related components 1030 may be combined with each other, together with the chip-related components described above.

Other components may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components are not limited thereto, but may also include passive components used for various other purposes, or the like. In addition, other components may be combined with each other, together with the chip-related components and/or the network related components described above.

Figure 7:
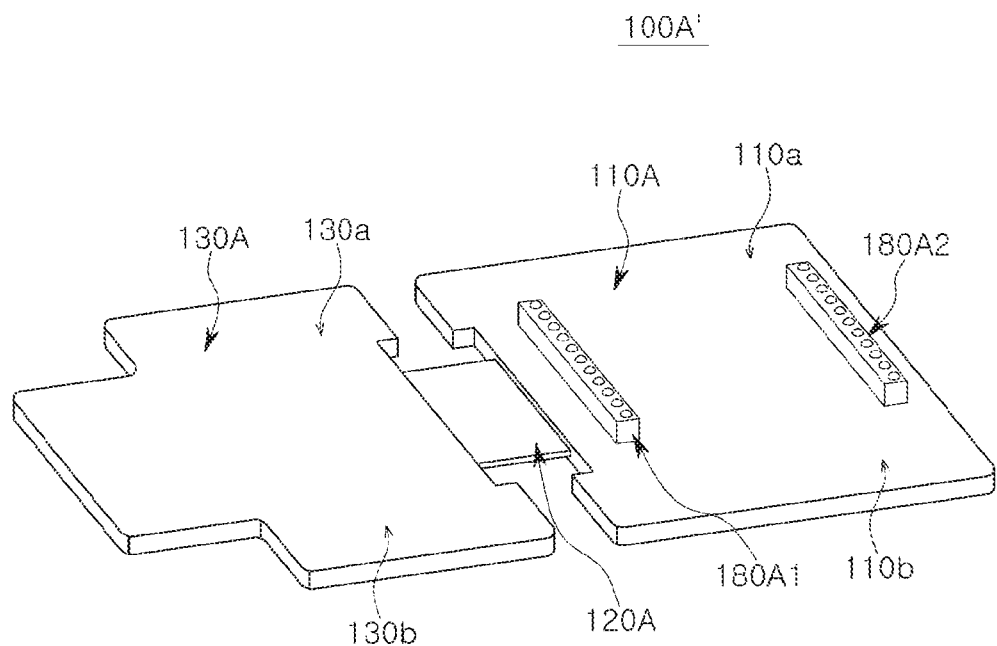
FIG. 7 is a perspective view schematically illustrating a modified example of the component mounting board of FIG. 3.
Figure 8:
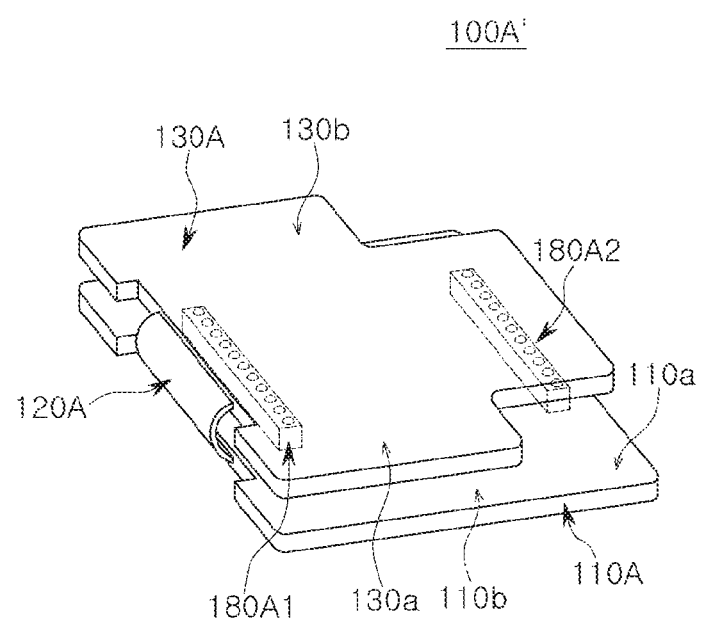
FIG. 8 is a perspective view schematically illustrating the connection substrate of FIG. 7 after bending.

FIG. 7 is a perspective view schematically illustrating a modified example of the component mounting board of FIG. 3, and FIG. 8 is a perspective view schematically illustrating the connection substrate of FIG. 7 after bending.

Figure 9:
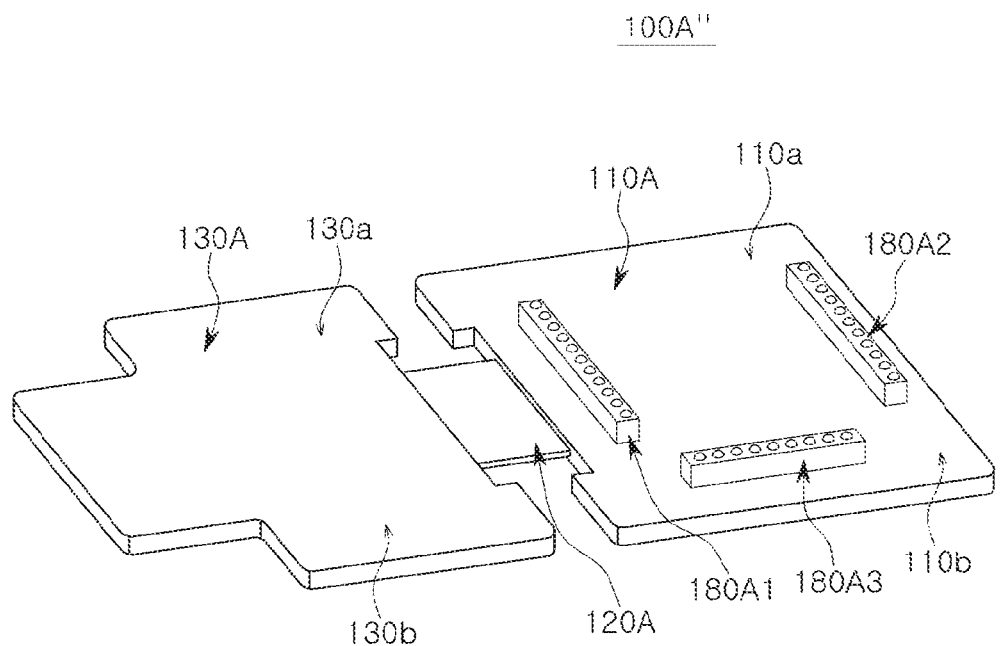
FIG. 9 is a perspective view schematically illustrating a modified example of the component mounting board of FIG. 3.
Figure 10:
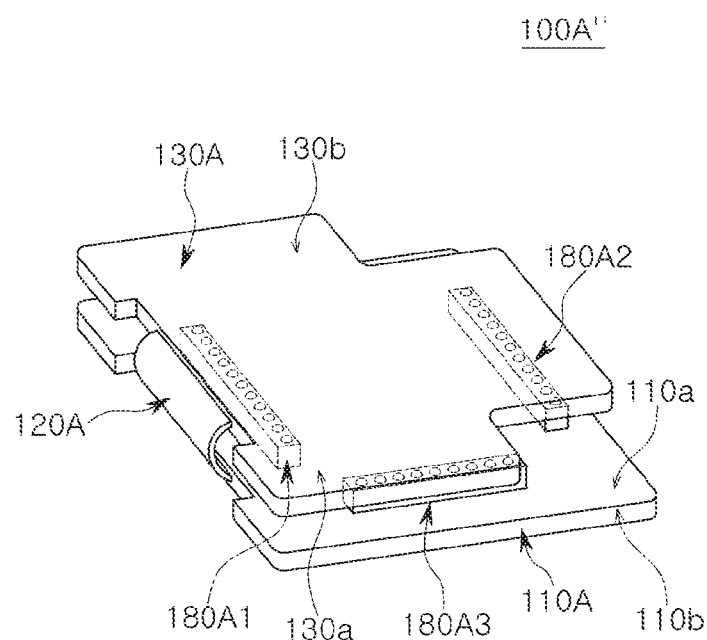
FIG. 10 is a perspective view schematically illustrating the connection substrate of FIG. 9 after bending.

FIG. 9 is a perspective view schematically illustrating a modified example of the component mounting board of FIG. 3, and FIG. 10 is a perspective view schematically illustrating the connection substrate of FIG. 9 after bending.

Referring to the drawings, a component mounting board 100A' according to a modified example may include two interposers 180A1 and 180A2 arranged to be spaced apart from each other on a first surface 110a of a first substrate 110A. In addition, a component mounting board 100A" according to a modified example may include three interposers 180A1, 180A2, and 180A3 arranged to be spaced apart from each other on the first surface 110a of the first substrate 110A. As such, a plurality of the interposers 180A1, 180A2, and 180A3 may be arranged. Each of the interposers 180A1, 180A2, and 180A3 may have the same size and shape, or the interposers may have different sizes and shapes. Each of the interposers 180A1, 180A2, and 180A3 may be disposed independently in a desired position.

The number of interposers 180A1, 180A2, and 180A3 is not particularly limited, and may be larger than that illustrated in the drawings. When a connection substrate 120A is bent, the plurality of interposers 180A1, 180A2, and 180A3 may be arranged in positions to provide various signal transmission paths between the first substrate 110A and the second substrate 130A with an efficient design. Since the other elements and aspects of the component mounting boards 100A' and 100A" may be substantially the same as those of component mounting board 100A described above, detailed description thereof will be omitted.

Figure 11:
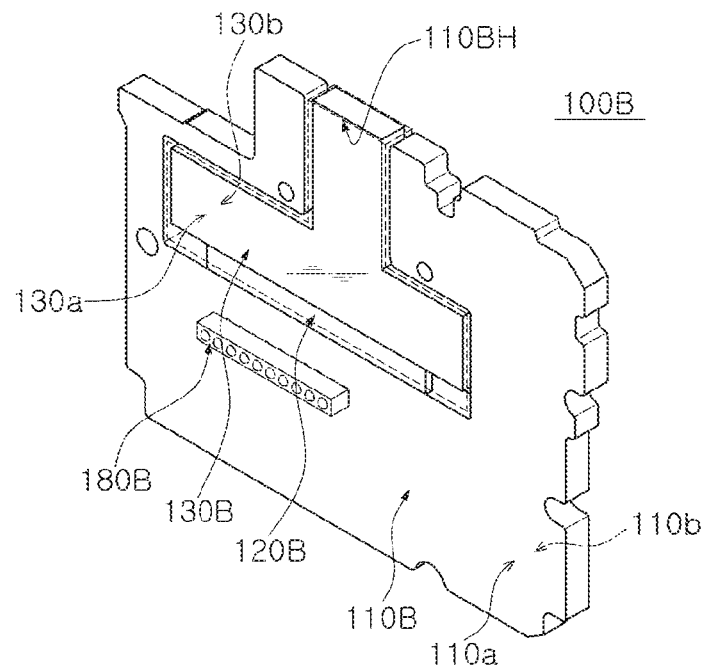
FIG. 11 is a perspective view schematically illustrating another example of a component mounting board.
Figure 12:
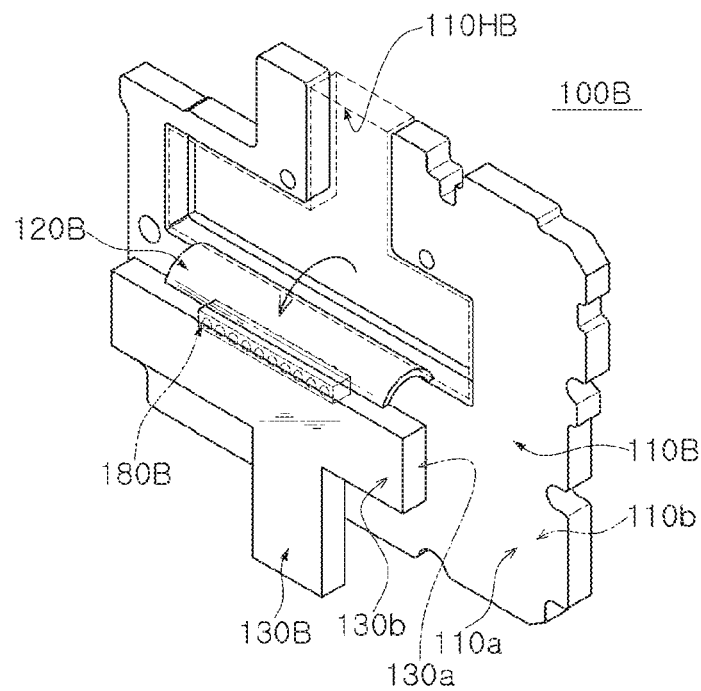
FIG. 12 is a perspective view schematically illustrating the connection substrate of FIG. 11 after bending.

FIG. 11 is a perspective view schematically illustrating another example of a component mounting board, and FIG. 12 is a perspective view schematically illustrating the connection substrate of FIG. 11 after bending.

Figure 13A:
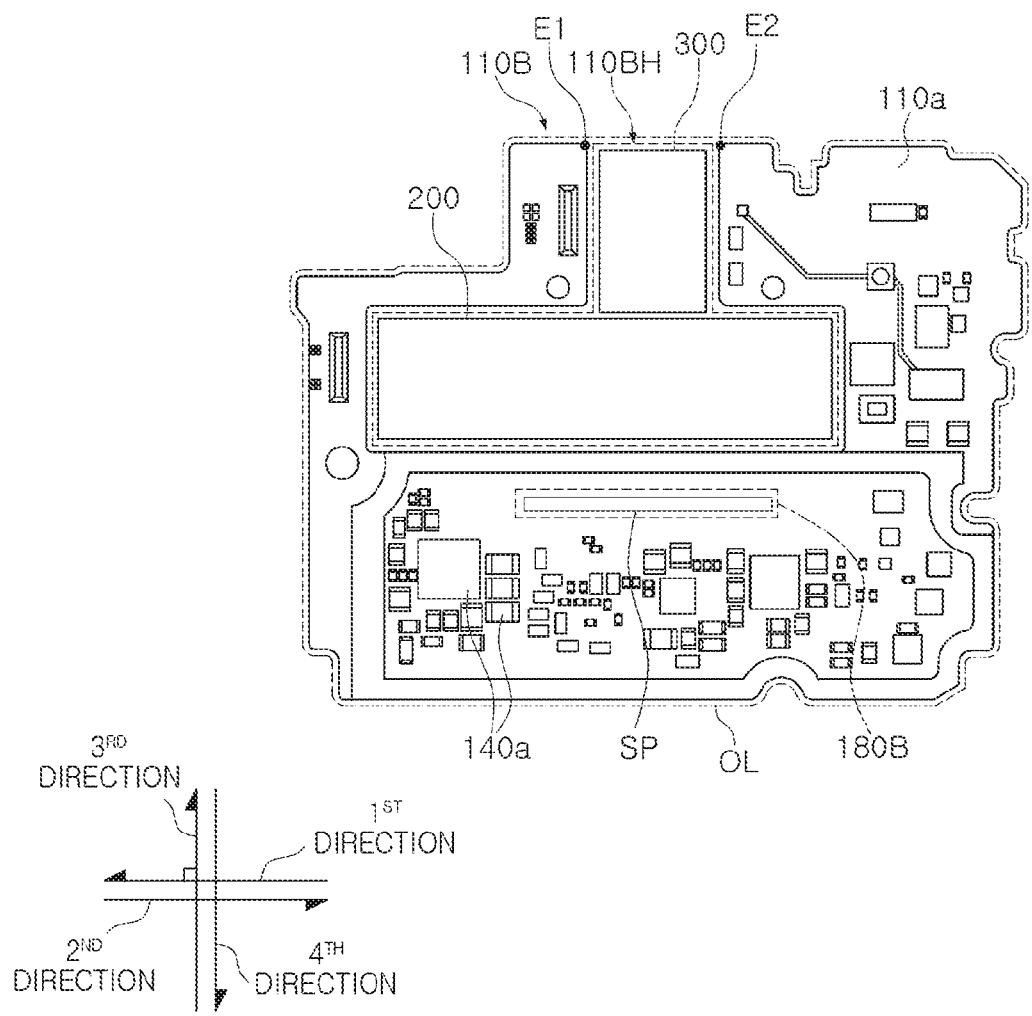
FIGS. 13A and 13B are plan views schematically illustrating the first and second surfaces of the first substrate of FIG. 11, respectively.
Figure 13B:
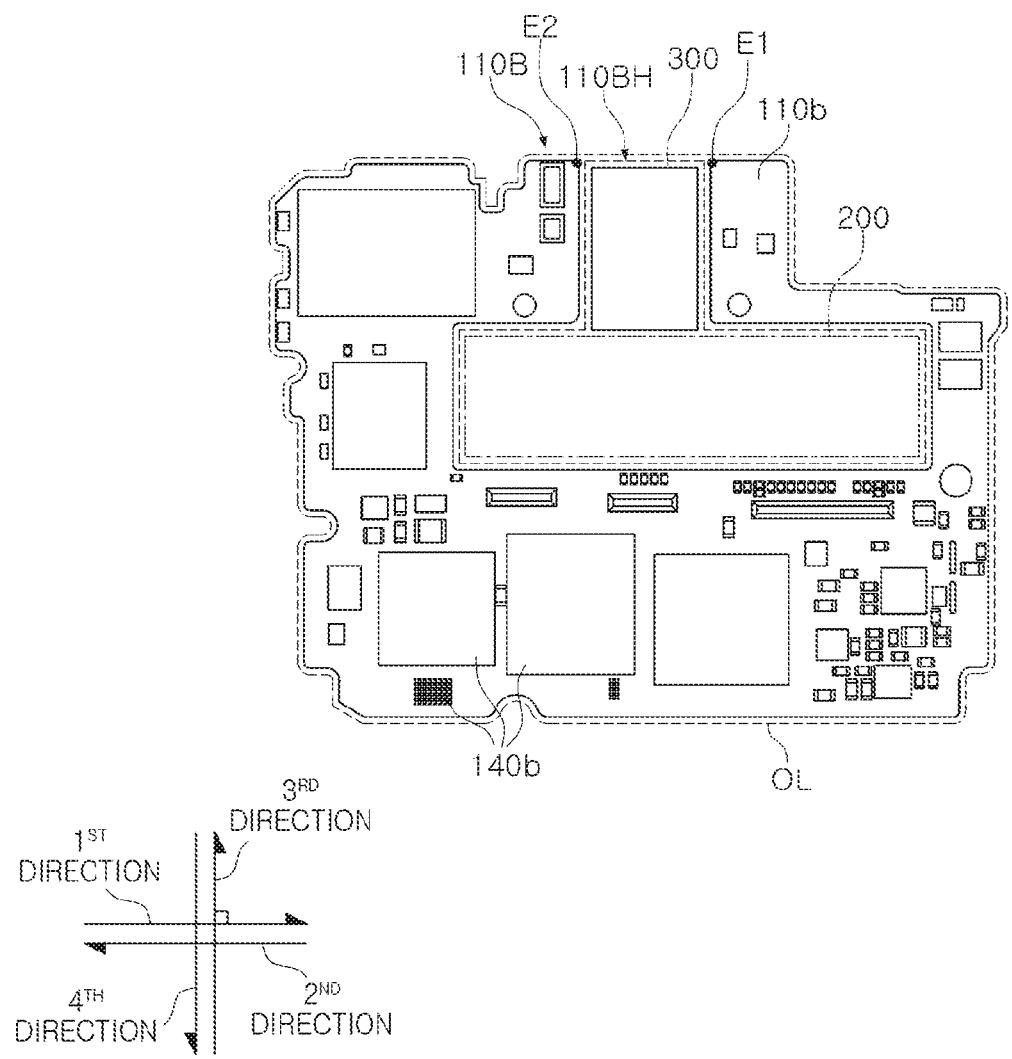
Figure 14A:
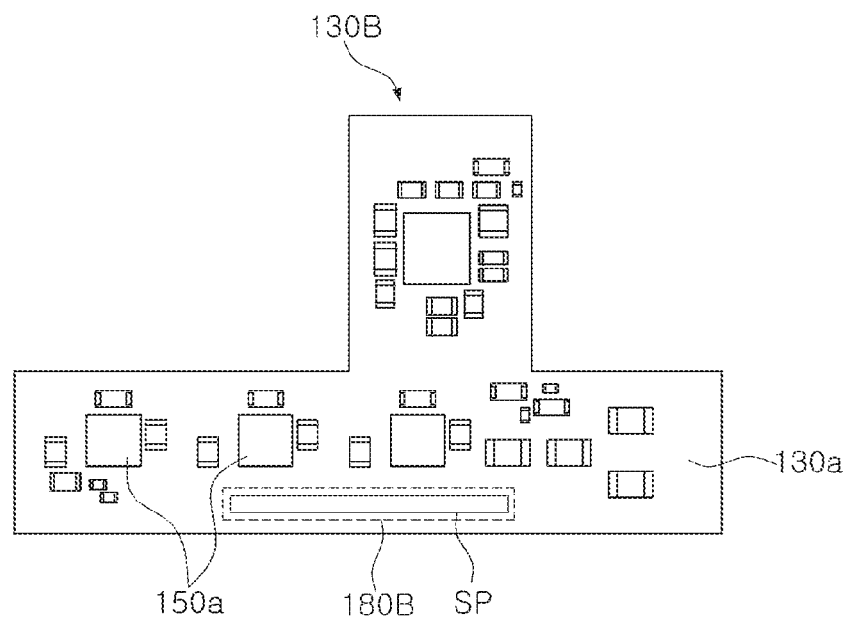
FIGS. 14A and 14B are plan views schematically illustrating third and fourth surfaces of the second substrate of FIG. 11, respectively.
Figure 14B:
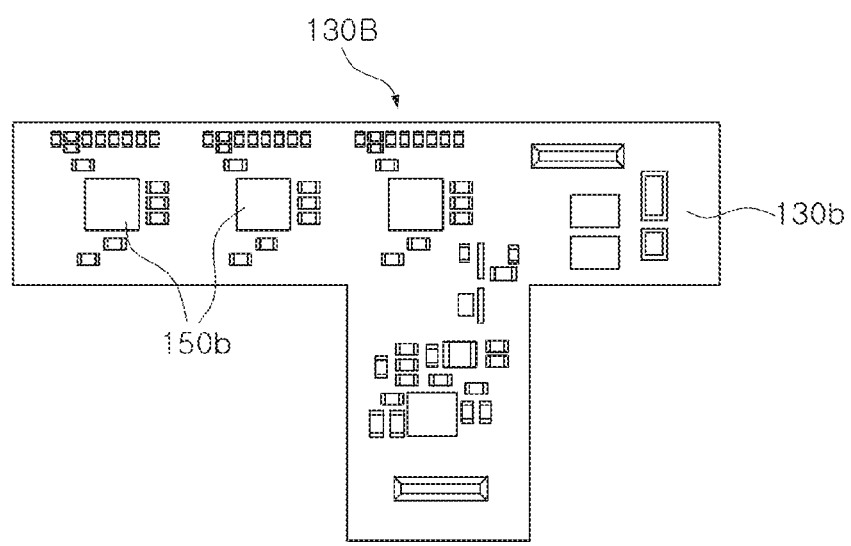

FIGS. 13A and 13B are plan views schematically illustrating the first and second surfaces of the first substrate of FIG. 11, respectively, and FIGS. 14A and 14B are plan views schematically illustrating third and fourth surfaces of the second substrate of FIG. 11, respectively.

Referring to the drawings, a component mounting board 100B according to another example may include a first substrate 110B having a first surface 110a, a second surface 110b, and a through-region 110BH or through-opening, a second substrate 130B having a third surface 130a and a fourth surface 130b, a connection substrate 120B connecting the first and second substrates 110B and 130B, and an interposer 180B disposed on the first surface 110a of the first substrate 110B. The interposer 180B may be also (e.g., additionally or alternatively) disposed on the third surface 130a of the second substrate 130B.

Before the connection substrate 120B is bent as illustrated in FIG. 12, the second substrate 130B may be disposed in the through-region 110BH as illustrated in FIG. 11, and at least a portion of a side surface of the second substrate 130B may be covered by (e.g., facing and overlapped with in the facing direction) the first substrate 110B. The through-region 110BH or through-opening may have an exposed region or exposed side open externally from the first substrate 110B, and the second substrate 130B may be disposed in the through-region 110BH, but a portion of the second substrate 130B may be deviated from the through-region 110BH by the exposed region of the through-region 110BH. The connection substrate 120B may connect the first substrate 110B and the second substrate 130B in the through-region 110BH of the first substrate 110B. For example, one end of the connection substrate 120B may be connected to a wall surface of the through-region 110BH of the first substrate 110B, and the other end of the connection substrate 120B may be connected to the side surface of the second substrate 130B. Therefore, the component mounting board 100B may have efficient space utilization even before bending.

When the connection substrate 120B is bent, as illustrated in FIG. 12, the second substrate 130B may be disposed on the first substrate 110B. When viewed in plan view, at least a portion of each of the first substrate 110B and the second substrate 130B may overlap each other, and at least a portion of each of the first surface 110a of the first substrate 110B and the third surface 130a of the second substrate 130B may face each other and be connected by the interposer 180B. For example, the connection substrate 120B may be a flexible substrate that may be bent such that at least a portion of the first surface 110a of the first substrate 110B faces at least a portion of the third surface 130a of the second substrate 130B. Therefore, the first substrate 110B, the second substrate 130B, and the connection substrate 120B may be configured to have a multilayer structure in a relatively simple manner. Therefore, compared with the multilayer structure described above, the manufacturing process may be relatively simple and the costs thereof may be reduced. In addition, since a signal transmission path between the first and second substrates 110B and 130B may be provided by the connection substrate 120B, a more efficient design of the signal transmission path is possible.

The interposer 180B may be partially disposed in a desired position between the first substrate 110B and the second substrate 130B, after the connection substrate 120B is bent. For example, at least a portion of each of the first surface 110a of the first substrate 110B and the third surface 130a of the second substrate 130B may be in contact with respective ends of the interposer 180B and be connected by the interposer 180B. In another example, unlike the large-area interposer substrate described above, since the interposer 180B may have a relatively small area, the interposer 180B may be produced at a relatively low cost, and there may be almost no problem of defects such as a warpage phenomenon, a solder non-bonding phenomenon, or the like. In addition, a signal transmission path may be supplemented by the interposer 180B, and the signal transmission path may be arranged in the desired position(s) and in the desired number. Therefore, the signal transmission path may be more efficiently designed. For example, the interposer 180B may be attached to a peripheral portion of a specific chip such as an application processor (AP) from which signal lines are mostly led-out. The interposer 180B may also serve as a spacer for physically supporting the first and second substrates 110B and 130B in the multilayer structure, after the connection substrate 120B is bent.

In the state of the multilayer structure after the connection substrate 120B is bent, since the through-region 110BH is considered to be an empty space in view of the component mounting board 100B, a separate electronic component such as a camera module 200 and/or a speaker 300 may be disposed in the space. For example, when the component mounting board 100B is used as a main board of an electronic device such as a smartphone, as illustrated in FIGS. 13A and 13B, a first electronic component 140a and/or a second electronic component 140b may be disposed on a first surface 110a and/or a second surface 110b of the first substrate 110B, respectively, and, as illustrated in FIGS. 14A and 14B, a third electronic component 150a and/or a fourth electronic component 150b may be disposed on a third surface 130a and/or a fourth surface 130b of the second substrate 130B, respectively. For example, the component mounting board 100B may be modularized. In this case, as illustrated in FIGS. 13A and 13B, in the component mounting board 100B, fifth electronic components (e.g., 200 and 300), for example a camera module 200 and/or a speaker 300 may be disposed in a through-region 110BH of the first substrate 110B after bending. The fifth electronic components 200 and 300 may be physically and/or electrically connected to the component mounting board 100B by a connector, a separate substrate, or the like. Alternatively, the fifth electronic components 200 and 300 may not be connected. The fifth electronic components 200 and 300 may be other types of modules or chip packages, and are not particularly limited. As such, the component mounting board 100B may have a multilayer structure having excellent space utilization, and may be usefully used as a main board in an electronic device such as a smartphone.

The through-region 110BH may penetrate between the first and second surfaces 110a and 110b of the first substrate 110B. As in another example, when viewed in plan view, the through-region 110BH may be surrounded by the first substrate 110B, but may be exposed from the first substrate 110B in some regions. Even in this case, most of the regions may be surrounded by the first substrate 110B. For example, when viewed in plan view, a length of a side portion of the through-region 110BH surrounded by the first substrate 110B may be greater than a length of a side portion of the through-region 110BH exposed from the first substrate 110B (e.g., a length of a side portion between points E1 and E2). It is useful to have such a through-region 110BH in view of space utilization. The through-region 110BH used in the present disclosure basically may refer to a space in which at least a portion of the connection substrate 120B and the second substrate 130B are accommodated before the connection substrate 120B is bent. In this regard, before the connection substrate 120B is bent, a portion of the side surface of the second substrate 130B may be exposed from the first substrate 110B. An area of a side surface of the second substrate 130B surrounded by the first substrate 110B may be larger than an area of aside surface of the second substrate 130B exposed from the first substrate 110B.

As in FIGS. 13A and 13B, in a plan view, when a first direction is referred to as one direction, substantially perpendicular to a side surface of the first substrate 110B having a substantially planar surface, a second direction is referred to as a direction, parallel to the first direction but substantially opposing the first direction, a third direction is referred to as another direction, substantially perpendicular to the first direction, and a fourth direction is referred to as a direction, parallel to the third direction but substantially opposing the third direction, the through-region 110BH may be blocked by the first substrate 110B in at least three of the first to fourth directions. For example, in another example, the through-region 110BH may be completely surrounded by the first substrate 110B in the first, second, and fourth directions, and a portion of the through-region 110BH may be exposed from the first substrate 110B in (or may be open through) the third direction. As appropriate, the through-region 110BH may be completely surrounded by the first substrate 110B in the first to fourth directions. For example, when viewed in plan view, the through-region 110BH may be open or closed.

When viewed in plan view, as illustrated in FIGS. 13A and 13B, the through-region 110BH may not extend out of an outline OL of the first substrate 110B. In this case, the outline OL means a line surrounding an outer side surface of an arbitrary appearance assuming when the through-region 110BH is not formed in the first substrate 110B. For example, as in another example, when there is a region recessed in a medial direction by formation of the through-region 110BH on the first substrate 110B in a plan view, two edges E1 and E2 of the first substrate 110B, starting portions of the recessed region, may be connected by a virtual line to define the outline OL. In another example, when a plurality of regions are recessed, at least a portion of the connection substrate 120B and the second substrate 130B may be accommodated before the connection substrate 120B is bent. The outline OL may be defined by connecting the two edges E1 and E2 in the recessed region by a virtual line. In another example, the through-region 110BH may not extend outside of a smallest convex line extending around a periphery of the first substrate 110B.

The through-region 110BH may have a shape corresponding to a shape of the second substrate 130B. For example, as illustrated in FIG. 11, before the connection substrate 120B is bent, the through-region 110BH may have a shape corresponding to a shape of the third surface 130a of the second substrate 130B, when viewed in plan view. In addition, as illustrated in FIG. 12, after the connection substrate 120B is bent, the through-region 110BH may have a shape corresponding to a shape symmetrical to a shape of the fourth surface 130b of the second substrate 130B, when viewed in plan view. In this case, having a shape corresponding thereto may include not only having exactly the same shape, but also having a shape approximately coinciding an outline thereof, when viewed in plan view. For example, in another example, when the second substrate 130B is rotated to a specific position, the second substrate 130B may have an approximately T shape. Similarly, the through-region 110BH may also have an approximately T shape, when rotating to a specific position.

The through-region 110BH may have an area larger than an area of each of the third and fourth surfaces 130a and 130b of the second substrate 130B, when viewed in plan view. In this case, the second substrate 130B may be more effectively disposed in the through-region 110BH together with the connection substrate 120B before bending. Therefore, the through-region 110BH may be utilized more effectively.

Since other descriptions such as non-contradictory details of the first and second substrates 110B and 130B, the connection substrate 120B, the interposer 180B, details of the mounting and disposition of electronic components, details of a case to be applied as a module, and the like are substantially the same as described above, detailed description thereof will be omitted.

Figure 15:
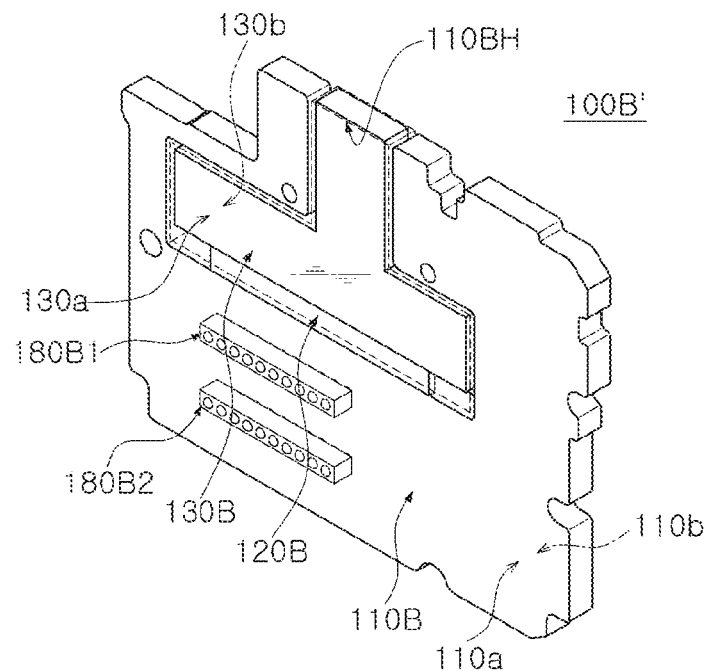
FIG. 15 is a perspective view schematically illustrating a modified example of the component mounting board of FIG. 11.
Figure 16:
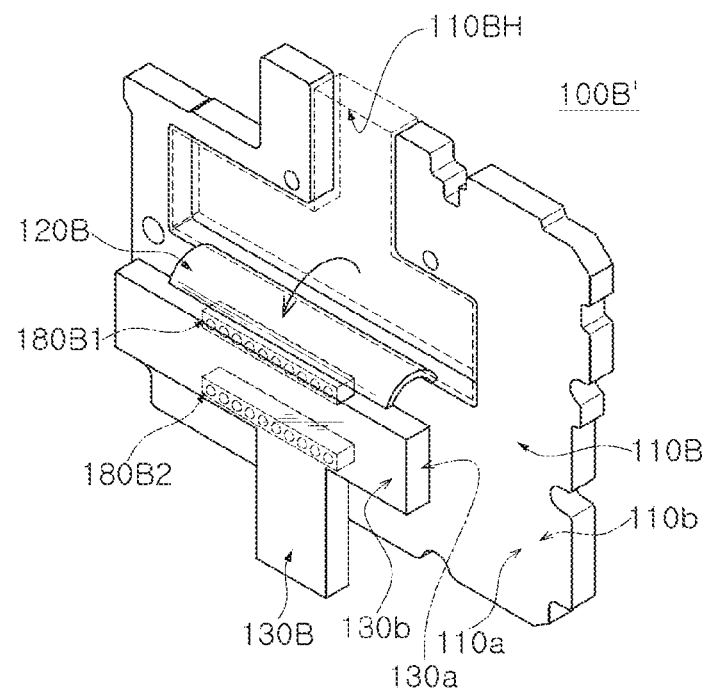
FIG. 16 is a perspective view schematically illustrating the connection substrate of FIG. 15 after bending.

FIG. 15 is a perspective view schematically illustrating a modified example of the component mounting board of FIG. 11, and FIG. 16 is a perspective view schematically illustrating the connection substrate of FIG. 15 after bending.

Figure 17:
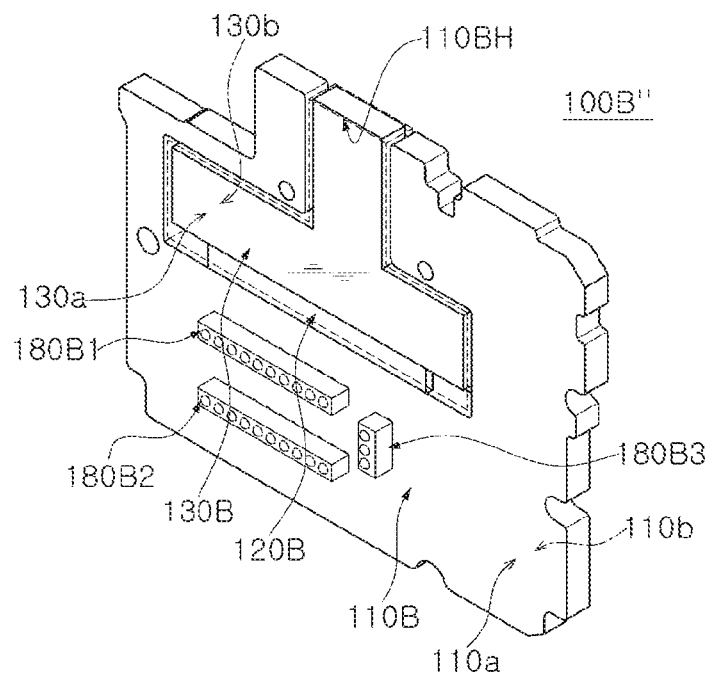
FIG. 17 is a perspective view schematically illustrating a modified example of the component mounting board of FIG. 11.
Figure 18:
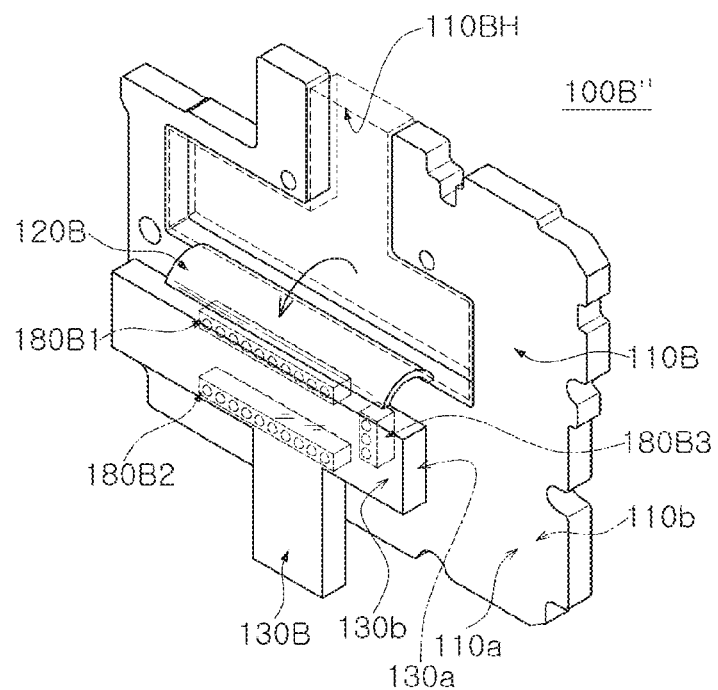
FIG. 18 is a perspective view schematically illustrating the connection substrate of FIG. 17 after bending.

FIG. 17 is a perspective view schematically illustrating a modified example of the component mounting board of FIG. 11, and FIG. 18 is a perspective view schematically illustrating the connection substrate of FIG. 17 after bending.

Referring to the drawings, a component mounting board 100B' according to a modified example may include two interposers 180B1 and 180B2 arranged to be spaced apart from each other on a first surface 110a of a first substrate 110B. In addition, a component mounting board 100B" according to a modified example may include three interposers 180B1, 180B2, and 180B3 arranged to be spaced apart from each other on the first surface 110a of the first substrate 110B. As such, the interposers 180B1, 180B2, and 180B3 may be arranged in plural. Each of the interposers 180B1, 180B2, and 180B3 may have the same size and shape, or the interposers 180B1, 180B2, and 180B3 may have different sizes and shapes. Each of the interposers 180B1, 180B2, and 180B3 may be disposed independently in a desired position. The number of interposers 180B1, 180B2, and 180B3 are not particularly limited, and also may be larger than that illustrated in the drawings. When a connection substrate 120B is bent, the plurality of interposers 180B1, 180B2, and 180B3 may be arranged in appropriate positions to provide various signal transmission paths between the first substrate 110B and the second substrate 130B with an efficient design. Since the other aspects of these embodiments may be substantially the same as described above, detailed description thereof will be omitted.

Figure 19:
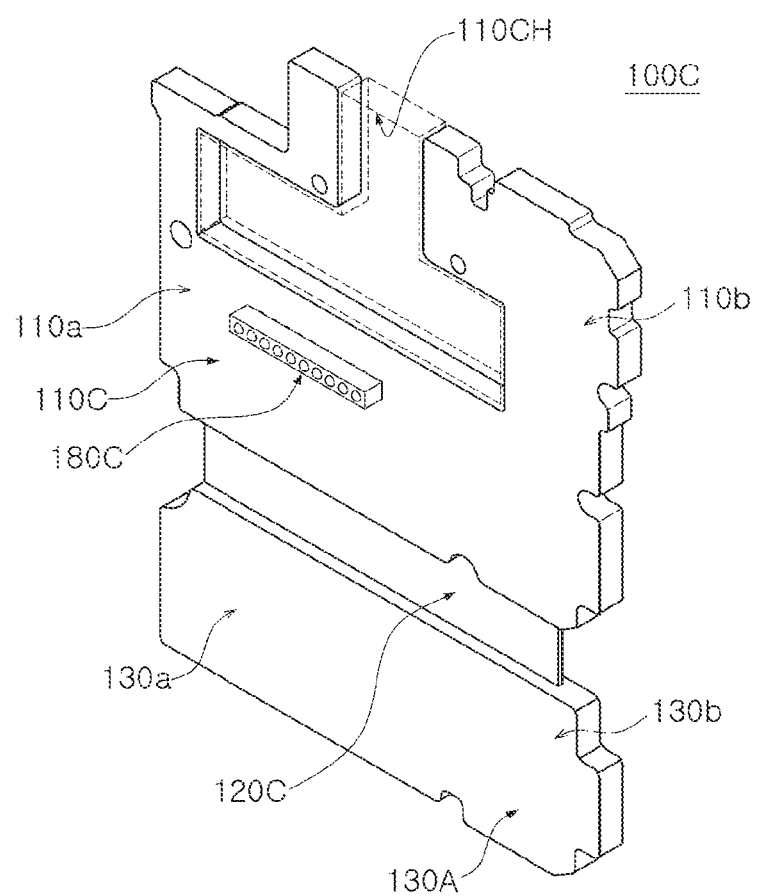
FIG. 19 is a perspective view schematically illustrating another example of a component mounting board.
Figure 20:
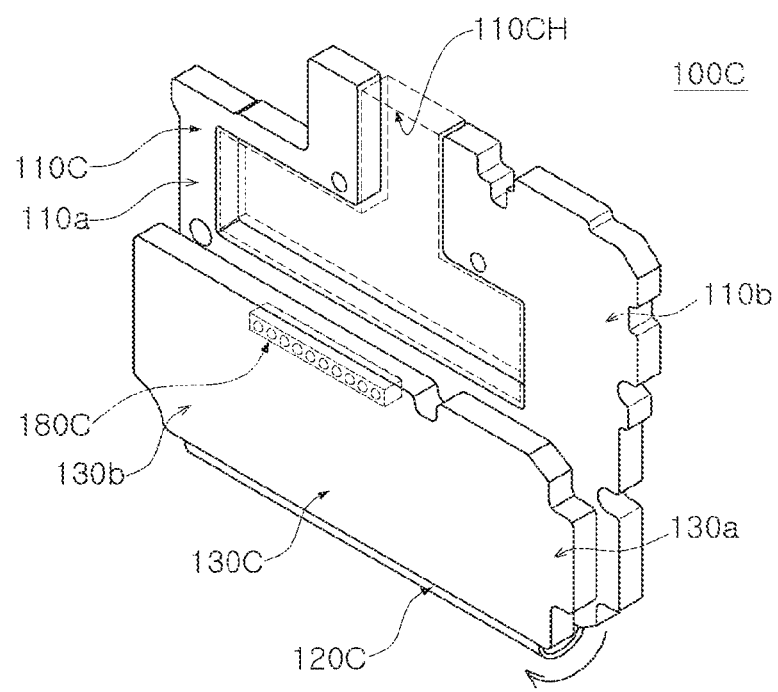
FIG. 20 is a perspective view schematically illustrating the connection substrate of FIG. 19 after bending.

FIG. 19 is a perspective view schematically illustrating another example of a component mounting board, and FIG. 20 is a perspective view schematically illustrating the connection substrate of FIG. 19 after bending.

Figure 21A:
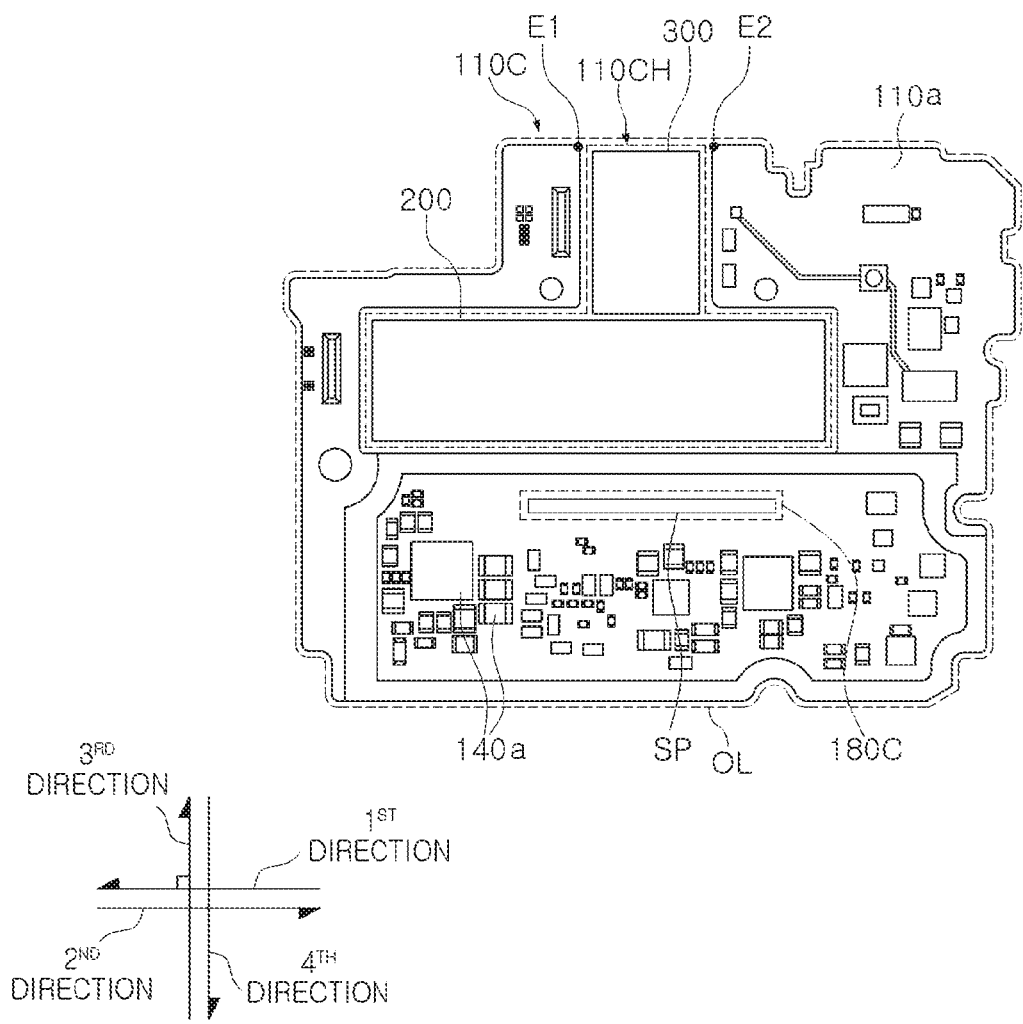
FIGS. 21A and 21B are plan views schematically illustrating the first and second surfaces of the first substrate of FIG. 19, respectively.
Figure 21B:
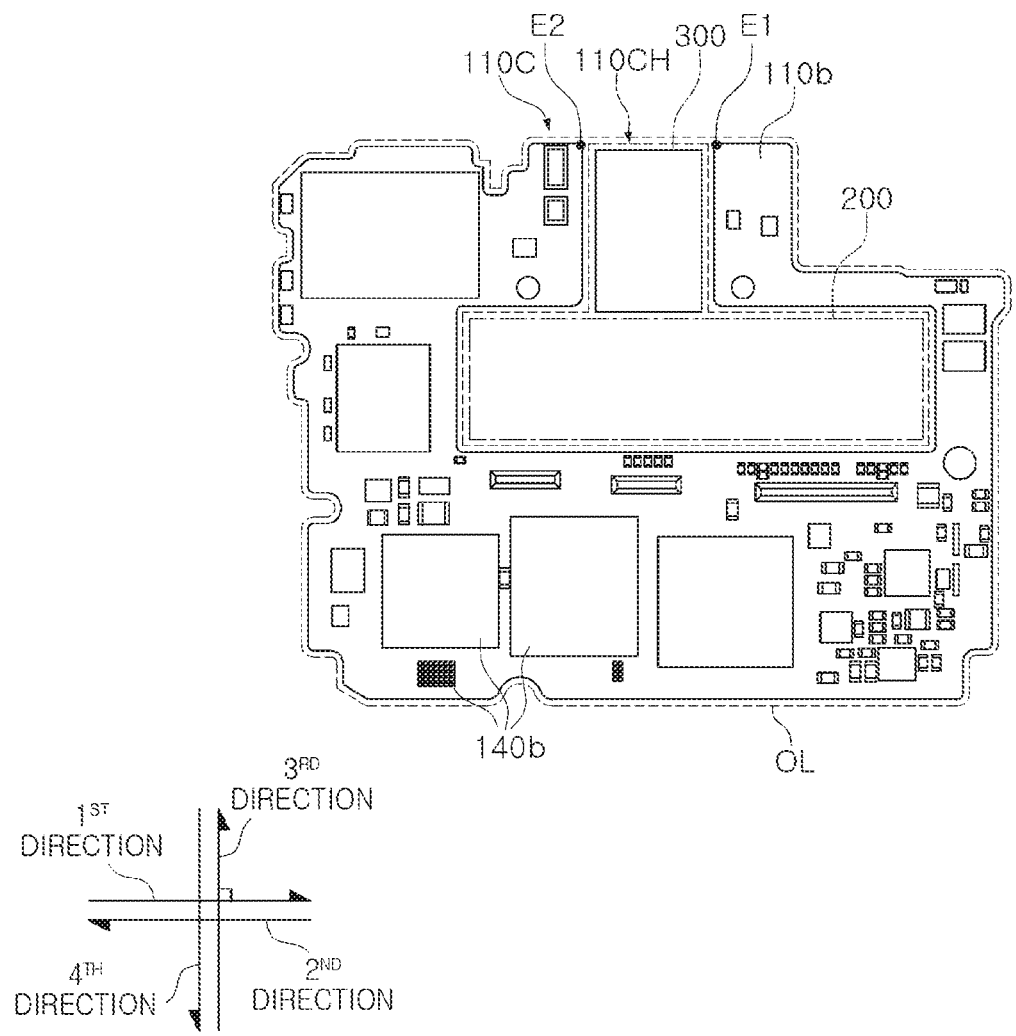
Figure 22A:
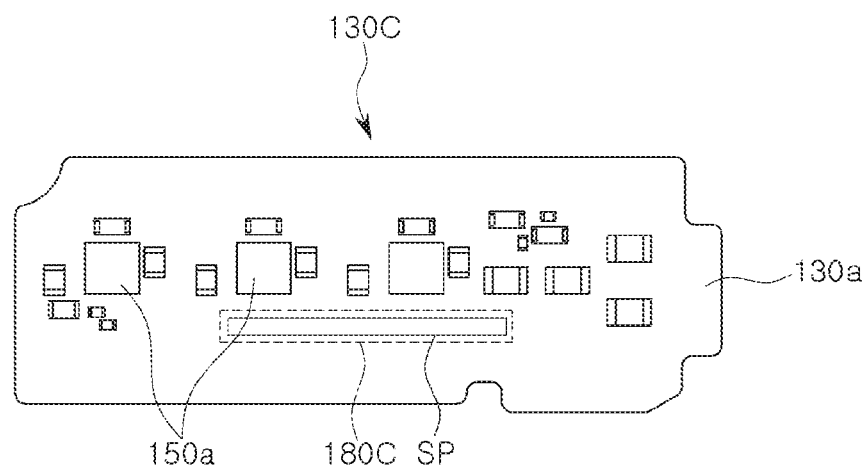
FIGS. 22A and 22B are plan views schematically illustrating the third and fourth surfaces of the second substrate of FIG. 19, respectively.
Figure 22B:
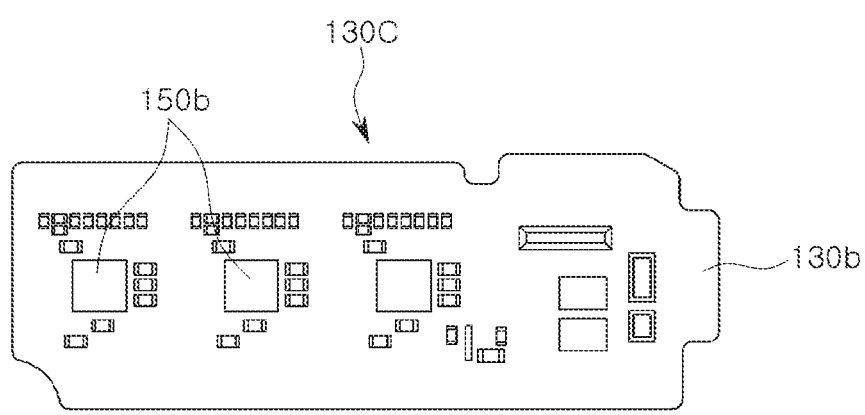

FIGS. 21A and 21B are plan views schematically illustrating the first and second surfaces of the first substrate of FIG. 19, respectively, and FIGS. 22A and 22B are plan views schematically illustrating the third and fourth surfaces of the second substrate of FIG. 19, respectively.

Referring to the drawings, a component mounting board 100C according to another example may include a first substrate 110C having a first surface 110a, a second surface 110b, and a through-region 110CH, a second substrate 130C having a third surface 130a and a fourth surface 130b, and a connection substrate 120C connecting the first and second substrates 110C and 130C. Unlike in the component mounting board 100B described above, the connection substrate 120C may be connected to a side surface of the first substrate 110C outside the through-region 110CH, not within the through-region 110CH. In addition, each of the third and fourth surfaces 130a and 130b of the second substrate 130C have a relatively large area. The component mounting board 100C may also include an interposer 180C disposed on the first surface 110a of the first substrate 110C. As necessary, the interposer 180C may be disposed on the third surface 130a of the second substrate 130C.

Before the connection substrate 120C is bent, as illustrated in FIG. 19, the first and second substrates 110C and 130C may be connected to each other by the connection substrate 120C outside the through-region 110CH. In addition, as illustrated in FIG. 20, after the connection substrate 120C is bent, the second substrate 130C may be disposed on the first substrate 110C. When viewed in plan view, at least a portion of each of the first surface 110a of the first substrate 110C and the third surface 130a of the second substrate 130C may overlap each other, and at least a portion of each of the first surface 110a of the first substrate 110C and the third surface 130a of the second substrate 130C may be connected by the interposer 180C. Therefore, the first substrate 110C, the second substrate 130C, and the connection substrate 120C may be configured to have a multilayer structure in a relatively simple manner. Therefore, compared with the multilayer structure described above, the manufacturing process may be relatively simple and the costs thereof may be reduced. In addition, since a signal transmission path between the first and second substrates 110C and 130C may be provided by the connection substrate 120C, a more efficient design of the signal transmission path is possible.

The interposer 180C may be partially disposed in a required position between the first substrate 110C and the second substrate 130C, after the connection substrate 120C is bent. For example, at least a portion of each of the first surface 110a of the first substrate 110C and the third surface 130a of the second substrate 130C may be connected by the interposer 180C. In another example, unlike the large-area interposer substrate described above, since the interposer 180C may have a relatively small area, the interposer 180C may be produced at a relatively low cost, and there may be almost no problem of defects such as a warpage phenomenon, a solder non-bonding phenomenon, or the like. In addition, a signal transmission path may be supplemented by the interposer 180C, and the signal transmission path may be arranged in the required position as the required number. Therefore, the signal transmission path may be more efficiently designed. For example, the interposer 180C may be attached to a peripheral portion of a specific chip such as an application processor (AP) from which signal lines are most led-out. The interposer 180C may also serve as a spacer for physically supporting the first and second substrates 110C and 130C in the multilayer structure, after the connection substrate 120C is bent.

In the state of the multilayer structure after the connection substrate 120C is bent, since the through-region 110CH is considered as an empty space in view of the component mounting board 100C, a separate electronic component such as a camera module 200 and/or a speaker 300 may be disposed in the space. For example, when the component mounting board 100C is used as a main board of an electronic device such as a smartphone, as illustrated in FIGS. 21A and 21B, a first electronic component 140a and/or a second electronic component 140b may be disposed on a first surface 110a and/or a second surface 110b of the first substrate 110C, respectively, and, as illustrated in FIGS. 22A and 22B, a third electronic component 150a and/or a fourth electronic component 150b may be disposed on a third surface 130a and/or a fourth surface 130b of the second substrate 130C, respectively. In addition, in the component mounting board 100C, fifth electronic components (e.g., 200 and 300), for example a camera module 200 and/or a speaker 300 may be disposed in a through-region 110CH. The fifth electronic components 200 and 300 may be physically and/or electrically connected to the component mounting board 100C by a connector, a separate substrate, or the like. As necessary, the fifth electronic components 200 and 300 may not be connected. The fifth electronic components 200 and 300 may be other types of modules or chip packages, and are not particularly limited. As such, the component mounting board 100C may have a multilayer structure having excellent space utilization, and may be usefully used as a main board in an electronic device such as a smartphone.

Since other descriptions such as non-contradictory details of the first and second substrates 110C and 130C, the connection substrate 120C, the interposer 180C, details of the mounting and disposition of electronic components, details of a case to be applied as a module, and the like are substantially the same as described above, detailed description thereof will be omitted.

Figure 23:
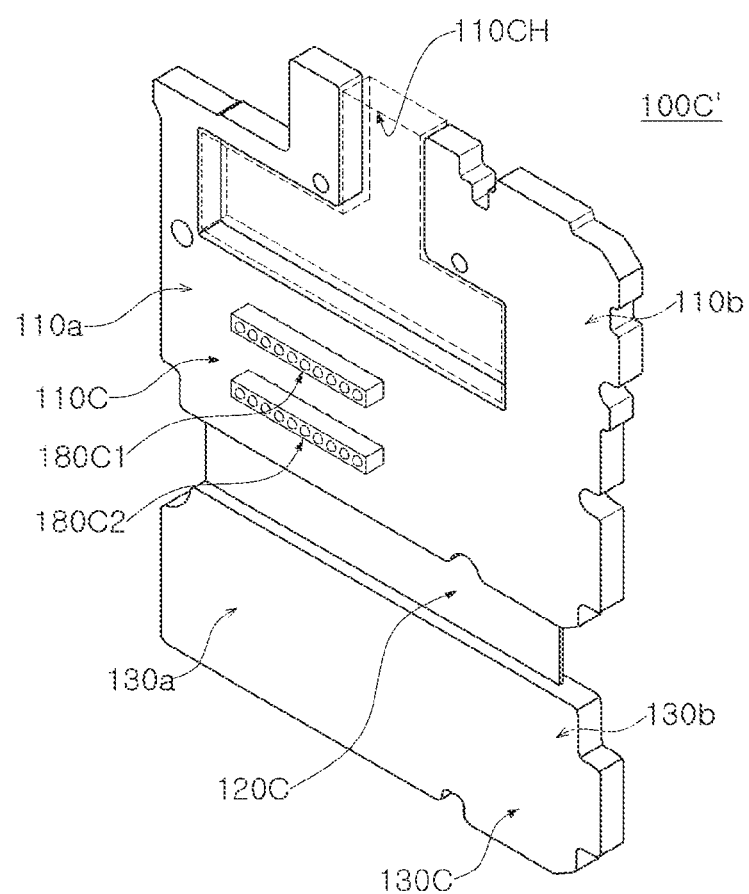
FIG. 23 is a perspective view schematically illustrating a modified example of the component mounting board of FIG. 19.
Figure 24:
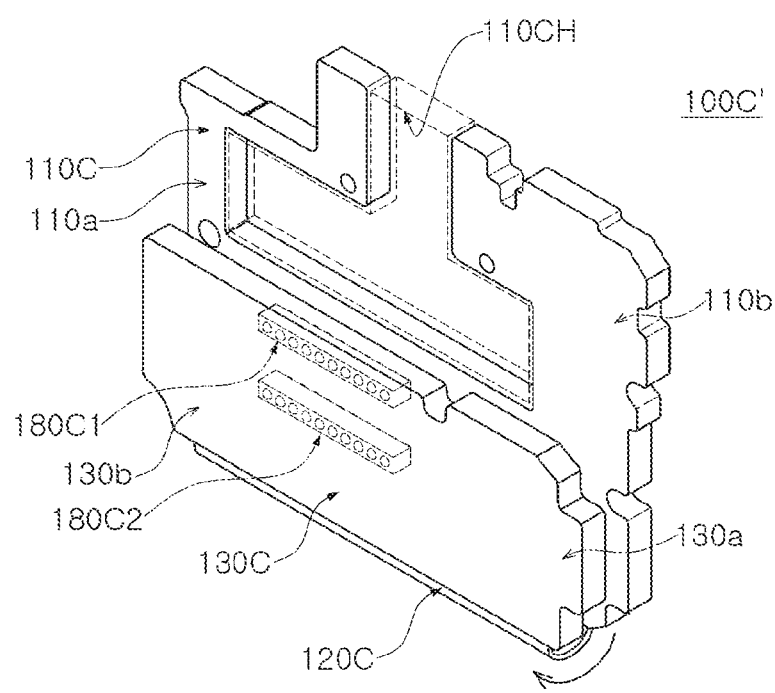
FIG. 24 is a perspective view schematically illustrating the connection substrate of FIG. 23 after bending.

FIG. 23 is a perspective view schematically illustrating a modified example of the component mounting board of FIG. 19, and FIG. 24 is a perspective view schematically illustrating the connection substrate of FIG. 23 after bending.

Figure 25:
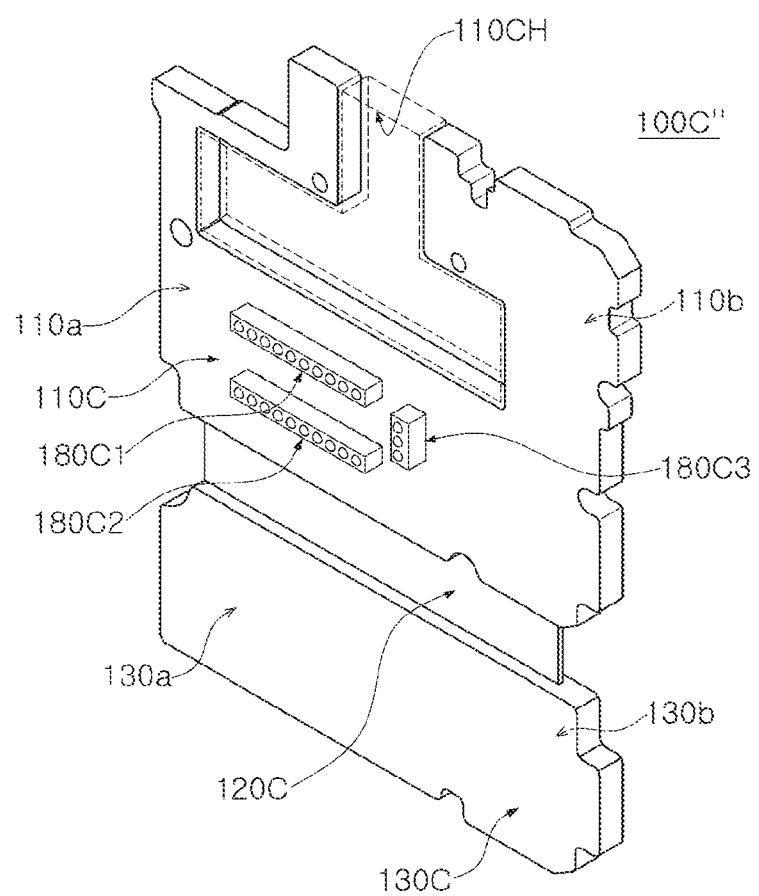
FIG. 25 is a perspective view schematically illustrating a modified example of the component mounting board of FIG. 19.
Figure 26:
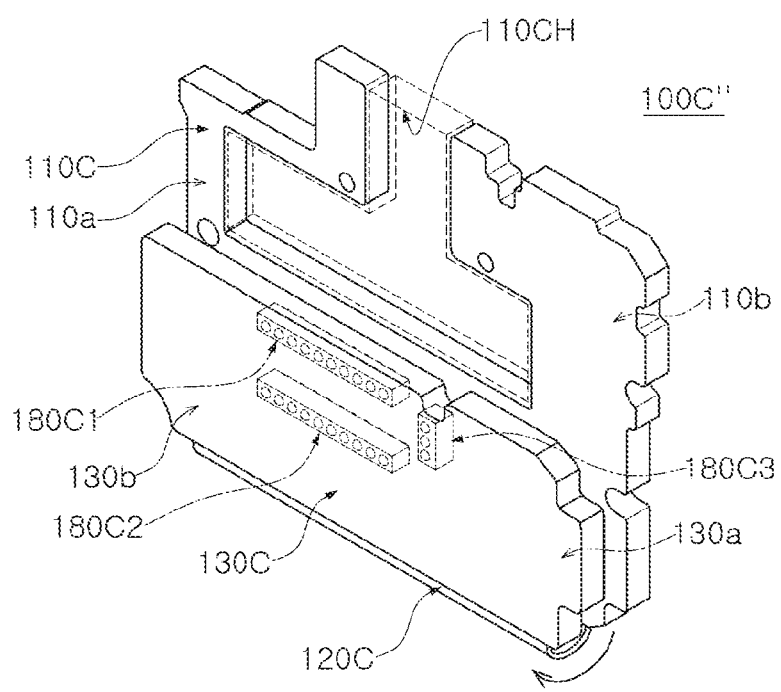
FIG. 26 is a perspective view schematically illustrating the connection substrate of FIG. 25 after bending.

FIG. 25 is a perspective view schematically illustrating a modified example of the component mounting board of FIG. 19, and FIG. 26 is a perspective view schematically illustrating the connection substrate of FIG. 25 after bending.

Referring to the drawings, a component mounting board 100C' according to a modified example may include two interposers 180C1 and 180C2 arranged to be spaced apart from each other on a first surface 110a of a first substrate 110C. In addition, a component mounting board 100C" according to a modified example may include three interposers 180C1, 180C2, and 180C3 arranged to be spaced apart from each other on the first surface 110a of the first substrate 110C. As such, the interposers 180C1, 180C2, and 180C3 may be arranged in plural. Each of the interposers 180C1, 180C2, and 180C3 may have the same size and shape, or may have different sizes and shapes.

Each of the interposers 180C1, 180C2, and 180C3 may be disposed independently in a required position. The number of interposers 180C1, 180C2, and 180C3 is not particularly limited, and may be larger than that illustrated in the drawings. When a connection substrate 120C is bent, the plurality of interposers 180C1, 180C2, and 180C3 may be arranged in necessary positions to provide various signal transmission paths toward between the first substrate 110C and a second substrate 130C with an efficient design. Since the others may be substantially the same as described above, detailed description thereof will be omitted.

Figure 27:
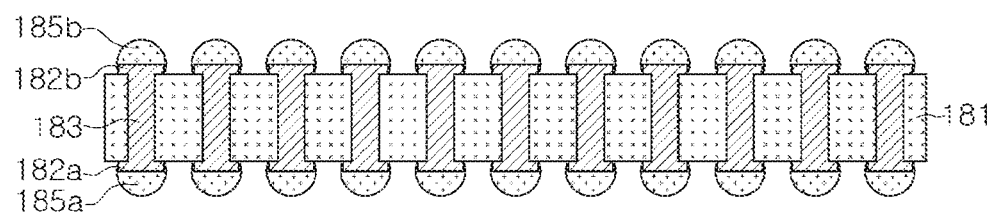
FIG. 27 is a cross-sectional view schematically illustrating an example of an interposer.

FIG. 27 is a cross-sectional view schematically illustrating an example of an interposer.

Referring to the drawings, an interposer 180-1 according to an example may include an insulating layer 181, a first wiring layer 182a disposed on one surface of the insulating layer 181, a second wiring layer 182b disposed on another surface of the insulating layer 181 opposite the one surface, a via layer 183 penetrating the insulating layer 181 and connecting the first and second wiring layers 182a and 182b, a first connection metal 185a disposed on the one surface of the insulating layer 181 and connected to the first wiring layer 182a, and a second connection metal 185b disposed on the other surface of the insulating layer 181 and connected to the second wiring layer 182b. The interposer 180-1 according to an example may be applied to the interposers 180A, 180A1, 180A2, 180A3, 180B, 180B1, 180B2, 180B3, 180C, 180C1, 180C2, and 180C3 of the component mounting boards 100A, 100A', 100A", 100B, 100B', 100B", 100C, 100C', and 100C". The interposer 180-1 according to an example may be also an organic interposer in which the insulating layer 181 includes an insulating resin. Since the organic interposer may be manufactured by a substrate process, a process of manufacturing the organic interposer may be relatively simple, and manufacturing costs thereof may be relatively low. The organic interposer may be manufactured by preparing a large-area interposer substrate and then sawing the same in units.

An insulating material may be used as a material of the insulating layer 181. In this case, as the insulating material, a thermosetting resin such as an epoxy resin, a thermoplastic resin such as polyimide, or materials including reinforcing materials such as inorganic fillers, and/or glass cloth, glass fabric, or the like, together therewith, such as a prepreg, Ajinomoto Build-up Film (ABF), a photoimageable dielectric (PID), and the like may be used. When the insulating layer is used as a plurality of insulating layers, materials of the insulating layers may be the same or different.

A metal material may be used as a material of the wiring layers 182a and 182b, In this case, as the metal material, copper (Cu), aluminum (Al), silver (Ag), tin (Sn), gold (Au), nickel (Ni), lead (Pb), titanium (Ti), alloys thereof, or the like may be used. The wiring layers 182a and 182b may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. Each of the patterns may include a line pattern, a plane pattern, and/or a pad pattern.

A metal material may be used as a material of the via layer 183. In this case, as the metal material, copper (Cu), aluminum (Al), silver (Ag), tin (Sn), gold (Au), nickel (Ni), lead (Pb), titanium (Ti), alloys thereof, or the like may be used. A connection via of the via layer 183 may be entirely filled with a metal material, or a metal material may be formed along a wall of a via hole. In addition, all known shapes such as a tapered shape, an hourglass shape, a cylindrical shape, or the like may be applied. The via layer 183 may also perform various functions, depending on a design of the layer. For example, the via layer may include a connection via for signal connection, a connection via for ground connection, a connection via for power connection, and the like.

The connection metals 185a and 185b may provide a physical and/or electrical connection path. The connection metals may be made of a low melting point metal having a lower melting point than copper Cu), for example, tin (Sn) or an alloy containing tin (Sn). For example, the connection metals 185a and 185b may be formed of a solder or the like, but are merely an example, and the materials thereof are not particularly limited thereto. The connection metals 185a and 185b may be a land, a ball, a pin, or the like. The connection metal may be formed of multiple layers or a single layer. In a case of being formed in multiple layers, the connection metal may include a copper pillar and solder. In a case of being formed in a single layer, the connection metal may include a tin-silver solder, but is merely an example, and is not limited thereto. The number, interval, arrangement, etc. of the connection metals 185a and 185b are not particularly limited, and may be sufficiently modified, depending on a design specification.

Figure 28:
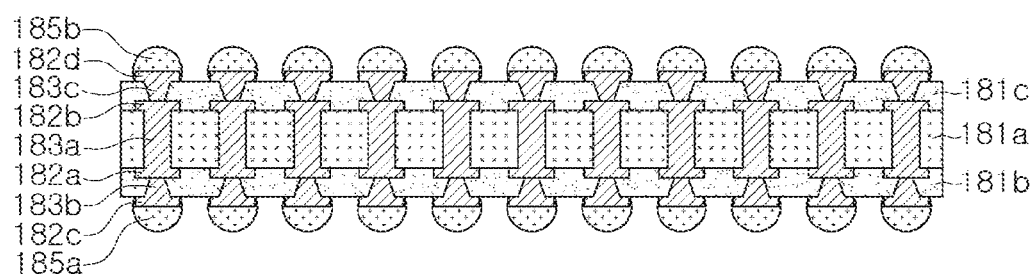
FIG. 28 is a cross-sectional view schematically illustrating another example of an interposer.

FIG. 28 is a cross-sectional view schematically illustrating another example of an interposer.

Referring to the drawings, an interposer 180-2 according to another example may be in a form of a multilayer substrate in which a plurality of insulating layers 181a, 181b, and 181c, a plurality of wiring layers 182a, 182b, 182c, and 182d, and a plurality of via layers 183a, 183b, and 183c are arranged. More specifically, the interposer 180-2 may be in a form of a core type of multilayer printed circuit board. In this case, a degree of freedom of wiring design may be improved, and a warpage phenomenon may be more effectively controlled. The first insulating layer 181a may be a core layer, and may be thicker than each of the second and third insulating layers 181b and 181c. An average diameter of a through-via of the first via layer 183a penetrating the first insulating layer 181a may be larger than an average diameter of each of connection vias of the second and third via layers 183b and 183c penetrating the second and third insulating layers 181b and 181c. The connection vias of the second and third via layers 183b and 183c may have tapered shapes in opposite directions. The interposer 180-2 according to another example may be also applied to the interposers 180A, 180A1, 180A2, 180A3, 180B, 180B1, 180B2, 180B3, 180C, 180C1, 180C2, and 180C3 of the component mounting boards 100A, 100A', 100A", 100B, 100B', 100B", 100C, 100C', and 100C". Since the interposer 180-2 according to another example may be also an organic interposer in which the insulating layers 181a, 181b, and 181c include an insulating resin, and the organic interposer may be manufactured by preparing a large-area interposer substrate by a substrate process and then sawing the same in units, a process of manufacturing the organic interposer may be relatively simple, and manufacturing costs thereof may be relatively low. Since the others may be substantially the same as described above, detailed description thereof will be omitted.

Figure 29:
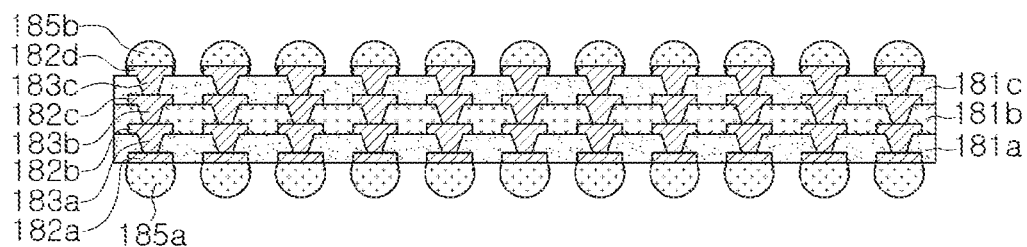
FIG. 29 is a cross-sectional view schematically illustrating another example of an interposer.

FIG. 29 is a cross-sectional view schematically illustrating another example of an interposer.

Referring to the drawings, an interposer 180-3 according to another example may be in a form of a multilayer substrate in which a plurality of insulating layers 181a, 181b, and 181c, a plurality of wiring layers 182a, 182b, 182c, and 182d, and a plurality of via layers 183a, 183b, and 183c are arranged. More specifically, the interposer 180-3 may be in a form of a coreless type of multilayer printed circuit board. In this case, a degree of freedom of wiring design may be improved, and a thickness thereof may be made thinner.

Connection vias of the via layers 183a, 183b, and 183c may have tapered shapes in the same direction. The interposer 180-3 according to another example may be also applied to the interposers 180A, 180A1, 180A2, 180A3, 180B, 180B1, 180B2, 180B3, 180C, 180C1, 180C2, and 180C3 of the component mounting boards 100A, 100A', 100A", 100B, 100B', 100B", 100C, 100C', and 100C". Since the interposer 180-3 according to another example may be also an organic interposer in which the insulating layers 181a, 181b, and 181c include an insulating resin, and the organic interposer may be manufactured by preparing a large-area interposer substrate by a substrate process and then sawing the same in units, a process of manufacturing the organic interposer may be relatively simple, and manufacturing costs thereof may be relatively low. Since the others may be substantially the same as described above, detailed description thereof will be omitted.

Figure 30:
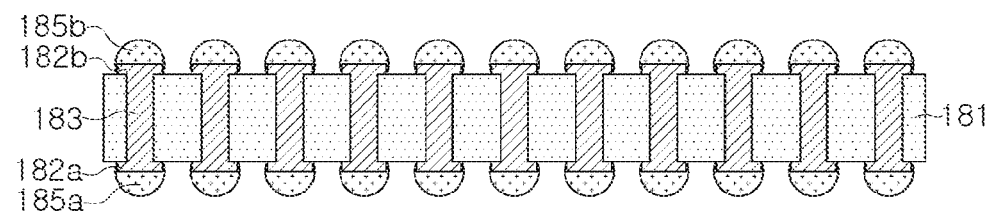
FIG. 30 is a cross-sectional view schematically illustrating another example of an interposer.

FIG. 30 is a cross-sectional view schematically illustrating another example of an interposer.

Referring to the drawings, an interposer 180-4 according to another example may include an insulating layer 181, a first wiring layer 182a disposed on one surface of the insulating layer 181, a second wiring layer 182b disposed on the other surface of the insulating layer 181, a via layer 183 penetrating the insulating layer 181 and connecting the first and second wiring layers 182a and 182b, a first connection metal 185a disposed on the one surface of the insulating layer 181 and connected to the first wiring layer 182a, and a second connection metal 185b disposed on the other surface of the insulating layer 181 and connected to the second wiring layer 182b. The insulating layer 181 may be a silicon interposer including silicon (Si). In addition, a connection via of the via layer 183 may be a through silicon via (TSV). The interposer 180-4 according to another example may be applied to the interposers 180A, 180A1, 180A2, 180A3, 180B, 180B1, 180B2, 180B3, 180C, 180C1, 180C2, and 180C3 of the component mounting boards 100A, 100A', 100A", 100B, 100B', 100B", 100C, 100C', and 100C". The interposer 180-4 according to another example may be manufactured through a semiconductor process including a wafer process, and may be manufactured by fabricating a large-area interposer substrate and then sawing the same in units. The interposer 180-4 according to another example may include a through silicon via and the like, and may be easy to implement a microcircuit or shorten a signal path. Since the others may be substantially the same as described above, detailed description thereof will be omitted.

In the present specification, the words "lower," "lower portion," "lower surface," and the like are used to refer to the downward direction with respect to the cross section of the drawing for convenience, while the words "upper," "upper portion," "upper surface," and the like are used to refer to a direction opposite thereto. It should be understood that, the definitions refer to directions for convenience of explanation, the scope of the claims is not particularly limited by the description of such directions, and the concepts of the upward/downward directions may be changed at any time.

The term of "connect" or "connection" in the present specification may be not only a direct connection, but also a concept including an indirect connection through an adhesive layer or the like. In addition, the term. "electrically connected" or "electrical connection" in the present specification is a concept including both a physical connection and a physical non-connection. Also, the expressions of "first," second," etc. in the present specification are used to distinguish one component from another, and do not limit the order and/or importance of the components. In some cases, without departing from the spirit of the present disclosure, a first component may be referred to as a second component, and similarly, a second component may be referred to as a first component.

The expression "example," except in relation to experimental examples, used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in this disclosure are used only to illustrate various examples and are not intended to limit the present inventive concept. Singular expressions include plural expressions unless the context clearly dictates otherwise.

According to an embodiment of the present disclosure, a component mounting board and an electronic device comprising the same, which may sufficiently secure a component mounting space by space utilization, may be provided.

According to an embodiment of the present disclosure, a component mounting board and an electronic device comprising the same, which may efficiently design a signal transmission path, may be provided.

According to an embodiment of the present disclosure, a component mounting board and an electronic device comprising the same, which may improve a problem of a warpage phenomenon or a solder non-bonding phenomenon, may be provided.

According to an embodiment of the present disclosure, a component mounting board and an electronic device comprising the same, which may reduce costs, may be provided.

While example embodiments have been illustrated and described above, it will be apparent to those skilled in the art that modifications and variations could be made without departing from the scope of the present disclosure as defined by the appended claims.

What is claimed is:

1. A component mounting board comprising:
a first substrate having a first surface, a second surface opposing the first surface, and a first side surface between the first and second surfaces, and including a first signal pattern;
a second substrate disposed on the first substrate, having a third surface, a fourth surface opposing the third surface, and a second side surface between the third and fourth surfaces, and including a second signal pattern;
a connection substrate bent to connect the first and second side surfaces;
an interposer disposed between the first and third surfaces and electrically connecting the first and second signal patterns; and
an electronic component mounted on at least one of the first to fourth surfaces,
wherein the interposer comprises an insulating layer, a first wiring layer disposed on one surface of the insulating layer, a second wiring layer disposed on another surface of the insulating layer, a first connection metal connected to the first wiring layer, a second connection metal connected to the second wiring layer, and a via layer penetrating the insulating layer and connecting the first and second wiring layers, and wherein each of the first and second connection metals comprises a solder.

2. The component mounting board according to claim 1, wherein the interposer has a hexahedron shape, and has an area smaller than an area of each of the first and second substrates, when viewed in plan view.

3. The component mounting board according to claim 1, wherein the first and second wiring layers are connected to the first and second signal patterns through the first and second connection metals, respectively.

4. The component mounting board according to claim 1, wherein the interposer is an organic interposer in which the insulating layer comprises an insulating resin.

5. The component mounting board according to claim 4, wherein the interposer is a multilayer substrate.

6. The component mounting board according to claim 1, wherein the interposer is a silicon interposer in which the insulating layer comprises silicon (Si).

7. The component mounting board according to claim 1, wherein the interposer includes a plurality of interposers, and the plurality of interposers are arranged to be spaced apart from each other.

8. The component mounting board according to claim 1, wherein the electronic component comprises a first electronic component disposed on the first surface of the first substrate, a second electronic component disposed on the second surface of the first substrate, a third electronic component disposed on the third surface of the second substrate, and a fourth electronic component disposed on the fourth surface of the second substrate.

9. The component mounting board according to claim 8, wherein each of the first to fourth electronic components comprises at least one of a semiconductor chip, a passive component, and a chip package including the semiconductor chip and the passive element.

10. The component mounting board according to claim 1, wherein the first substrate has a through-region,
wherein the connection substrate is connected to the first side surface in the through-region.

11. The component mounting board according to claim 10, wherein the through-region has a shape corresponding to a shape of the second substrate, when viewed in plan view.

12. The component mounting board according to claim 10, wherein the through-region is surrounded by the first substrate in at least three directions perpendicular to each other or parallel to each other but facing in different directions, when viewed in plan view.

13. An electronic device comprising the component mounting board of claim 1.

14. A component mounting board comprising:
a first substrate having first and second surfaces opposing each other, and a through-opening disposed within a smallest convex outline extending around a periphery of the first substrate and extending from the first surface to the second surface;
a second substrate disposed on the first substrate, and having a third surface facing the first surface and a fourth surface opposing the third surface;
a connection substrate extending between a first side surface of the first substrate abutting the through-opening and a second side surface of the second substrate abutting the third and fourth surfaces of the second substrate; and
an interposer disposed between the first and third surfaces,
wherein the interposer comprises an insulating layer, a first wiring layer disposed on one surface of the insulating layer, a second wiring layer disposed on another surface of the insulating layer, a first connection metal connected to the first wiring layer, a second connection metal connected to the second wiring layer, and a via layer penetrating the insulating layer and connecting the first and second wiring layers, and wherein each of the first and second connection metals comprises a solder.

15. The component mounting board of claim 14, wherein the second substrate has an area no larger than an area of the through-opening of the first substrate.

16. The component mounting board of claim 14, wherein the connection substrate has a flexibility higher than both of the first and second substrates.

17. The component mounting board of claim 14, further comprising:

one or more interposers disposed between the first and third surfaces and electrically connecting first signal patterns of the first substrate and second signal patterns of the second substrate.

18. A component mounting board comprising:

a first substrate having a plurality of signal patterns;

an interposer substrate disposed on a first surface of the first substrate, having an area smaller than the first surface of the first substrate, and including a plurality of vias connected to respective signal patterns of the plurality of signal patterns of the first substrate;

a second substrate disposed on the interposer substrate to face the first substrate, and having a plurality of signal patterns connected to respective vias of the plurality of vias of the interposer substrate; and a connection substrate bent to connect a first side surface of the first substrate and a second side surface of the second substrate, wherein the interposer substrate further comprises an insulating layer, a first wiring layer disposed on one surface of the insulating layer, a second wiring layer disposed on another surface of the insulating layer, a first connection metal connected to the first wiring layer, and a second connection metal connected to the second wiring layer, wherein the plurality of vias penetrate the insulating layer and connect the first and second wiring layers, and wherein each of the first and second connection metals comprises a solder.

19. The component mounting board of claim 18, wherein the interposer substrate comprises an insulating layer, a first wiring layer disposed on one surface of the insulating layer, a second wiring layer disposed on another surface of the insulating layer, and a via layer including the plurality of vias penetrating the insulating layer and connecting the first and second wiring layers.

20. The component mounting board of claim 18, wherein the interposer substrate comprises a plurality of interposer substrates spaced apart from each other and each including first and second wiring layers connected by a plurality of vias penetrating an insulating layer disposed between the first and second wiring layers.

* * * * *